(12) United States Patent
Dempsey et al.

(10) Patent No.: US 12,445,139 B2
(45) Date of Patent: Oct. 14, 2025

(54) DAC WITH CONFIGURABLE OUTPUT STAGE

(71) Applicant: Analog Devices International Unlimited Company, Limerick (IE)

(72) Inventors: Dennis A. Dempsey, Newport (IE); Michael C. Lynch, Newport (IE); Ivan Bucoy Santos, General Trias (PH); Fintan M. Leamy, Ennis (IE); Fergus John Downey, Oranmore (IE)

(73) Assignee: Analog Devices International Unlimited Company, Limerick (IE)

( * ) Notice: Subject to any disclaimer, the term of this patent is extended or adjusted under 35 U.S.C. 154(b) by 204 days.

(21) Appl. No.: 18/032,036

(22) PCT Filed: Oct. 29, 2021

(86) PCT No.: PCT/EP2021/080144
§ 371 (c)(1),
(2) Date: Apr. 14, 2023

(87) PCT Pub. No.: WO2022/090475
PCT Pub. Date: May 5, 2022

(65) Prior Publication Data
US 2023/0396260 A1    Dec. 7, 2023

Related U.S. Application Data

(60) Provisional application No. 63/108,151, filed on Oct. 30, 2020.

(51) Int. Cl.
*H03M 1/12* (2006.01)
*H03F 3/30* (2006.01)
*H03M 1/00* (2006.01)

(52) U.S. Cl.
CPC .......... *H03M 1/004* (2013.01); *H03F 3/3027* (2013.01); *H03F 2203/45026* (2013.01)

(58) Field of Classification Search
CPC ....... H03M 1/004; H03M 1/66; H03F 3/3027; H03F 2203/45026; H03F 2203/45522;
(Continued)

(56) References Cited

U.S. PATENT DOCUMENTS

| 5,184,129 A | 2/1993 | Fung et al. |
| 5,519,310 A | 5/1996 | Bartlett |

(Continued)

FOREIGN PATENT DOCUMENTS

| CN | 202257335 | * | 5/2012 |
| CN | 202257335 U | | 5/2012 |

(Continued)

OTHER PUBLICATIONS

"AD420: Serial Input 16-Bit 4 mA-20 mA, 0 mA-20 mA DAC", Analog Devices, (2015), 16 pgs.
(Continued)

*Primary Examiner* — Jean B Jeanglaude
(74) *Attorney, Agent, or Firm* — Schwegman Lundberg & Woessner, P.A.

(57) ABSTRACT

A configurable output stage for a DAC channel can include an output stage that can receive an analog output from a DAC and outputs a signal to an output terminal. The output stage can be configurable between a voltage mode and a current mode. In the voltage mode, the output stage can supply the analog signal to the output terminal as a voltage signal. In the current mode, the output stage can supply the analog signal to the output signal as a current signal. The output stage can receive user input to select the desired mode. Consequently, an integrated circuit can be implemented with multiple DAC channels, each having the con-
(Continued)

figurable output stage. A user can choose how many channels they want to operate in a voltage output mode, and how many channels they want to operate in a current output mode, depending on their individual requirements.

20 Claims, 22 Drawing Sheets

(58) Field of Classification Search
CPC ............. H03F 2203/45534; H03F 1/34; H03F 3/45475
USPC .......................................................... 341/155
See application file for complete search history.

(56) References Cited

U.S. PATENT DOCUMENTS

| | | | |
|---|---|---|---|
| 5,764,174 | A | 6/1998 | Dempsey et al. |
| 6,806,771 | B1 | 10/2004 | Hildebrant et al. |
| 7,336,706 | B2 | 2/2008 | Krafft et al. |
| 7,403,041 | B2 | 7/2008 | Bajdechi et al. |
| 7,728,749 | B2 | 6/2010 | Sahu |
| 7,756,677 | B1 | 7/2010 | Li |
| 7,899,099 | B2 | 3/2011 | Bergmann et al. |
| 8,089,383 | B2 | 1/2012 | Williams et al. |
| 8,089,384 | B1 | 1/2012 | Williams et al. |
| 8,487,859 | B2 | 7/2013 | Kim et al. |
| 8,878,709 | B2 | 11/2014 | Hyodo et al. |
| 9,203,350 | B2 | 12/2015 | Dempsey et al. |
| 9,354,644 | B2 | 5/2016 | Sharma et al. |
| 9,917,557 | B1 | 3/2018 | Zhu et al. |
| 9,929,703 | B1 | 3/2018 | Zhao et al. |
| 10,175,193 | B2 | 1/2019 | Chandrasekhar et al. |
| 10,181,853 | B2 | 1/2019 | Slattery et al. |
| 10,608,662 | B2 | 3/2020 | Wong et al. |
| 10,700,699 | B1 | 6/2020 | Briaire |
| 10,965,251 | B1 * | 3/2021 | Yeh .......................... H03M 1/66 |
| 11,398,829 | B1 * | 7/2022 | Wang ....................... H03M 1/66 |
| 2007/0200622 | A1 * | 8/2007 | Filoramo ............. H03D 7/1441 330/10 |
| 2014/0084970 | A1 | 3/2014 | Van Der Goes et al. |
| 2018/0323760 | A1 * | 11/2018 | Wadekar ............. H03F 3/45237 |
| 2020/0127610 | A1 | 4/2020 | Kusuda et al. |
| 2023/0396265 | A1 | 12/2023 | Downey et al. |

FOREIGN PATENT DOCUMENTS

| | | |
|---|---|---|
| CN | 116438745 | 7/2023 |
| WO | WO-2022090475 A1 | 5/2022 |

OTHER PUBLICATIONS

"AD5522: Quad Parametric Measurement Unit with Integrated 16-Bit Level Setting DACs", Analog Devices, (2018), 64 pgs.
"AD5560: 1.2 A Programmable Device Power Supply with Integrated 16-Bit Level Setting DACs", Analog Devices, (2008), 66 pgs.
"AD5672R/AD5676R: Octal, 12-/16-Bit nanoDAC+ with 2 ppm/°C Reference, SPI Interface", Analog Devices, (2014), 36 pgs.
"AD5770R: 6-Channel, 14-Bit, Current Output DAC with On-Chip Reference, SPI Interface", Analog Devices, (2019), 61 pgs.
"Application Report—AN-1515 A Comprehensive Study of the Howland Current Pump", Texas Instruments, (2013), 17 pgs.
"International Application Serial No. PCT/EP2021/080144, International Search Report mailed Feb. 24, 2022", 5 pgs.
"International Application Serial No. PCT/EP2021/080144, Written Opinion mailed Feb. 24, 2022", 9 pgs.
"International Application Serial No. PCT/EP2021/080147, International Search Report mailed Feb. 24, 2022", 9 pgs.
"International Application Serial No. PCT/EP2021/080147, Written Opinion mailed Feb. 24, 2022", 9 pgs.
"Quad-Channel Industrial Voltage and Current Output Driver Reference Design (EMC/EMI Tested)", Texas Instruments, (2018), 24 pgs.
Baker, R. Jacob, "CMOS Circuit Design, Layout, and Simulation", IEEE Series on Microelectronic Systems, Wiley, (2010), 1214.
Hastings, Alan, "The Art of Analog Layout", 2nd Ed., Pearson, (2005), 662 pgs.
Hogervorst, Ron, et al., "A Compact Power-Efficient 3 V CMOS Rail-to-Rail Input/Output Operational Amplifier for VLSI Cell Libraries", IEEE Journal of Solid-State Circuits, vol. 29, No. 12, (Dec. 1994), 9 pgs.
Monticelli, D. M, "A quad CMOS single-supply op amp with rail-to-rail output swing", IEEE Journal of Solid-State Circuits, 21(6), (1986), 1026-1034.
Schoenwetter, Howard K, "A High-Speed Low-Noise 18-Bit Digital-to-Analog Converter", IEEE Transactions on Instrumentation and Measurement, 27(4), (Dec. 1978), 413-417.
Sheingold, D. H, "Impedance and Admittance Transformations using Operational Amplifiers", The Lightning Empiricist, 12(1), (1964), 2 pgs.
Song, Young-Hoon, et al., "A 6-Gbit/s Hybrid Voltage-Mode Transmitter With Current-Mode Equalization in 90-nm CMOS", IEEE Transactions on Circuits and Systems—II: Express Briefs, 59(8), (Aug. 2012), 491-495.
Wells, Colin, et al., "Combined Voltage and Current Output with the DACx760", Texas Instruments Application Report SBAA199, (Jul. 2014), 20 pgs.
Huijsing, Johan, "Chapter 5: Output Stages", Operational Amplifiers: Theory and Design, 3rd Ed., Springer Cham, (2017), 105-155.
"U.S. Appl. No. 18/032,043, Corrected Notice of Allowability mailed Apr. 9, 2025", 2 pgs.
"U.S. Appl. No. 18/032,043, Notice of Allowance mailed Mar. 24, 2025", 10 pgs.
"U.S. Appl. No. 18/032,043, PTO Response to Rule 312 Communication mailed Apr. 22, 2025", 2 pgs.
"European Application Serial No. 21805420.3, Communication Pursuant to Article 94(3) EPC mailed May 12, 2025", 12 pgs.
"European Application Serial No. 21805877.4, Communication Pursuant to Article 94(3) EPC mailed May 19, 2025", 17 pgs.

* cited by examiner

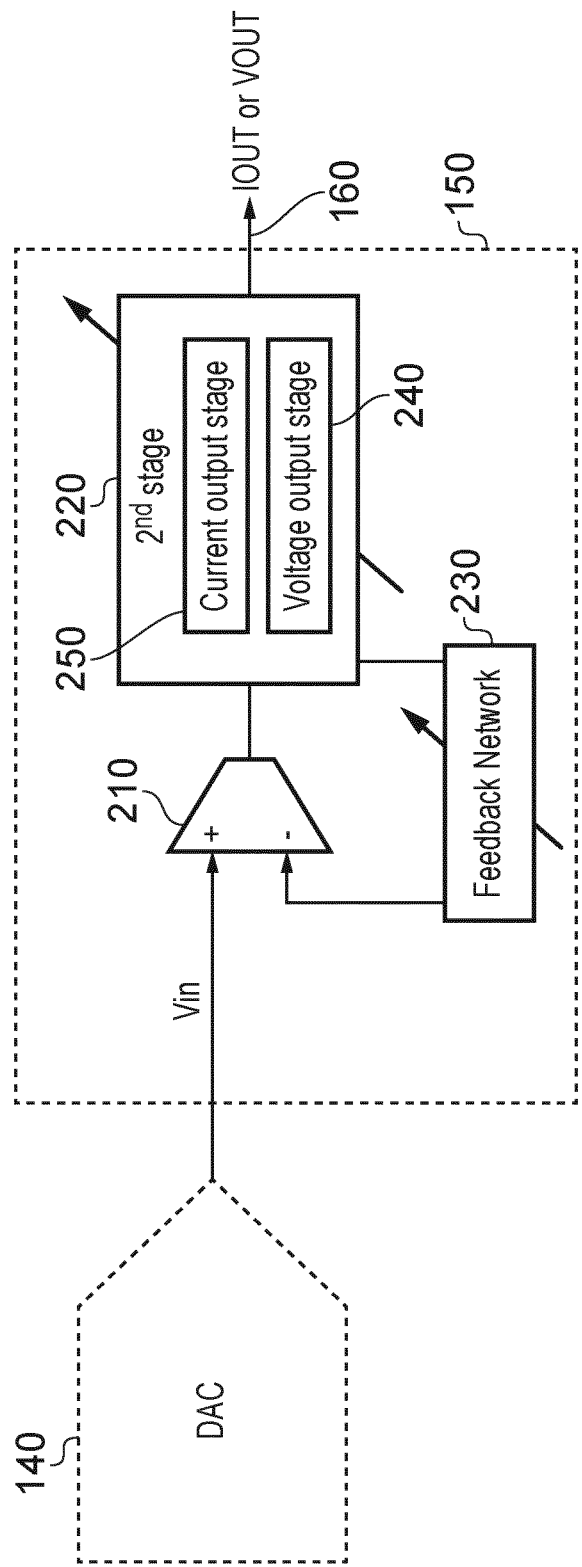
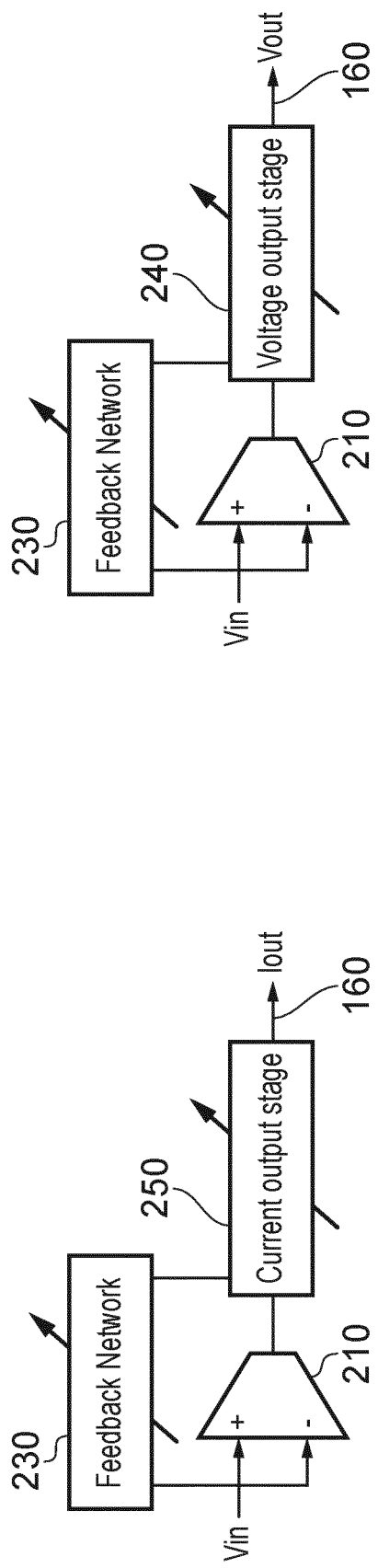
FIG. 2A
FIG. 2B
FIG. 2C

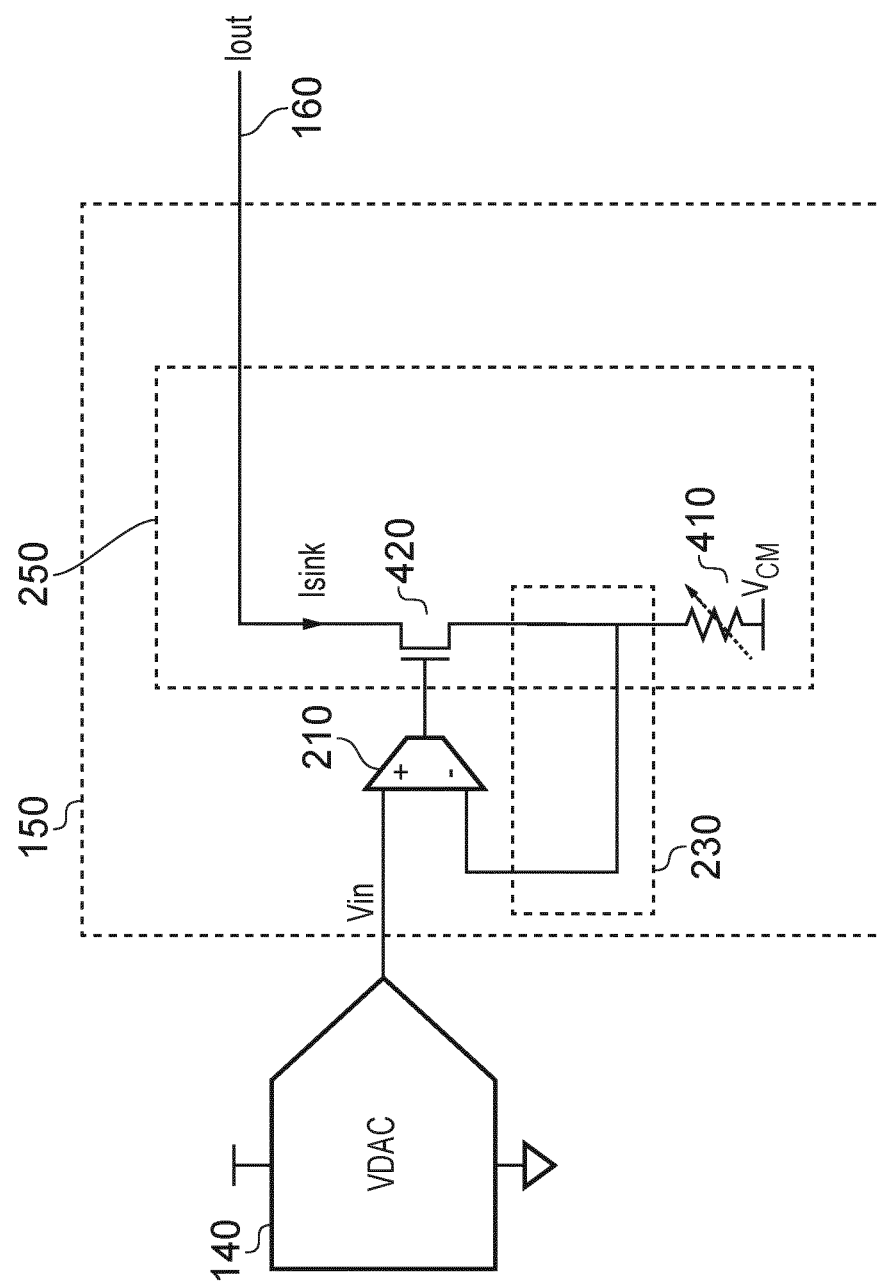

DAC WITH CONFIGURABLE OUTPUT STAGE

CLAIM OF PRIORITY

This application is a U.S. National Stage of PCT Application No. PCT/2021/0080144, filed Oct. 29, 2021, and published as WO 2022/090475 A1 on May 5, 2022, which claims priority to U.S. Provisional Application No. 63/108,151 filed on Oct. 30, 2020, which are hereby incorporated by reference herein in their entirety.

TECHNICAL FIELD

The present disclosure relates to a DAC or a DAC channel having a configurable output stage for providing current or voltage mode outputs.

BACKGROUND

Integrated circuits may provide a plurality of DAC channels that convert digital signals to analog signals. Each channel may output the analog signals to respective output terminals (e.g. pins, leads or bumps) of the chip. However, each channel may have a static output stage which supplies the analog output to the output terminal as either a voltage output signal or a current output signal. Different users may use the integrated circuit for different use cases or applications. The different applications may require different numbers of voltage output channels and current output channels. Usually, the integrated circuit must provide a large number of channels to ensure there is a sufficient number of voltage output channels and current output channels for each use case. However, this approach takes up significant chip area.

In complex systems using multiple channel DACs, the system design requirements may change or a new system design may need similar, but different requirements.

SUMMARY

The present disclosure relates to a configurable output stage for a DAC channel. The output stage receives an analog output from a DAC and outputs a signal to an output terminal. The output stage is configurable between a voltage mode and a current mode. In the voltage mode, the output stage supplies the analog signal to the output terminal as a voltage signal. In the current mode, the output stage supplies the analog signal to the output signal as a current signal. The output stage can receive user input to select the desired mode. Consequently, an integrated circuit can be implemented with multiple DAC channels, each having the configurable output stage. A user can choose how many channels they want to operate in a voltage output mode, and how many channels they want to operate in a current output mode, depending on their specific requirements. Advantageously, the number of channels included on the integrated circuit can be significantly reduced whilst meeting varying user requirements.

In a first aspect of the present disclosure, there is provided an integrated circuit comprising a DAC configured to output an analog signal, an output terminal, and an output stage arranged to receive the analog signal from the DAC. The output stage is configured to operate in a first mode to supply the analog signal to the output terminal as a first signal type, and in a current mode to supply the analog signal to the output terminal as a second signal type.

In a second aspect of the present disclosure, there is provided a method comprising providing an integrated circuit, including: a DAC configured to output an analog signal, an output terminal, and an output stage arranged to receive the analog signal from the DAC. The output stage is configured to operate in a voltage mode to supply the analog signal to the output terminal as a voltage signal, and in a current mode to supply the analog signal to the output terminal as a current signal. The method comprises receiving a control signal indicative of a selection of the voltage mode or the current mode, and configuring the output stage to operate in the voltage mode or the current mode based on the control signal.

In a third aspect of the present disclosure, there is provided an integrated circuit comprising a plurality of channels including a first channel and a second channel, each channel comprising: a DAC configured to output an analog signal, an output terminal, and an output stage arranged to receive the analog signal from the DAC. Each output stage is configured to operate in a voltage mode to supply the analog signal to the output terminal as a voltage signal, and in a current mode to supply the analog signal to the output terminal as a current signal.

BRIEF DESCRIPTION OF THE DRAWINGS

Examples of the present disclosure are now described with reference to the accompanying drawings, in which:

FIG. 2A shows a schematic view of an output stage of the DAC channel of FIG. 1 according to an example of the present disclosure;

FIG. 2B shows a schematic view of the output stage of FIG. 2A in a current output mode, according to an example of the present disclosure;

FIG. 2C shows a schematic view of the output stage of FIG. 2A in a voltage output mode, according to an example of the present disclosure;

FIG. 4A shows a circuit level view of the output stage of FIGS. 2A and/or 2B in a current sink output mode, according to an example of the present disclosure;

DETAILED DESCRIPTION

A configurable output stage for a DAC channel is described. The output stage may be provided in between a DAC and an output terminal of an integrated circuit. The output stage operates in both a voltage mode and a current mode. In the voltage mode, the output stage provides the analog output signal of the DAC to the output pin as a voltage output signal. In the current mode, the output stage provides the analog output signal of the same DAC to the same output pin, but instead as a current output signal. The output stage comprises a first stage coupled to the output of the DAC, which may be or include a difference amplifier. The output stage further comprises voltage mode circuitry and current mode circuitry. In the voltage mode, the output stage combines the first stage with the voltage mode circuitry such that the first stage and the voltage mode circuitry together forms a voltage amplifier. For example, the voltage mode circuitry may include a voltage buffer coupled between the output of the first stage and the output pin, such as a class AB linear buffer. The voltage mode circuitry may also include a feedback path between the output pin and the input of the first stage that comprises a network of resistors. The network may determine the gain of the first stage and therefore the gain of the voltage amplifier. As such, in the voltage mode, the output stage will output a voltage signal that is buffered and amplified version of the analog signal. Furthermore, in the current mode, the output stage combines the first stage with the current mode circuitry such that the first stage and the current mode circuitry together function as a voltage-to-current converter, such as a transconductance amplifier. For example, the current mode circuitry may include at least one MOS transistor and a resistor arranged at the output of the first stage, and a feedback path between the MOS transistor and an input of the first stage, such that the first stage and the current mode circuitry behaves as a transconductance amplifier. In some examples, the feedback path may comprise a short circuit between the transistor and the input of the first stage, but in other examples the feedback path can be provided with a current mirror. As such, in the current mode, the output stage will output a current signal that is proportional to the analog signal. A user can provide user input to the output stage to select a mode of the output stage.

Figure 1:
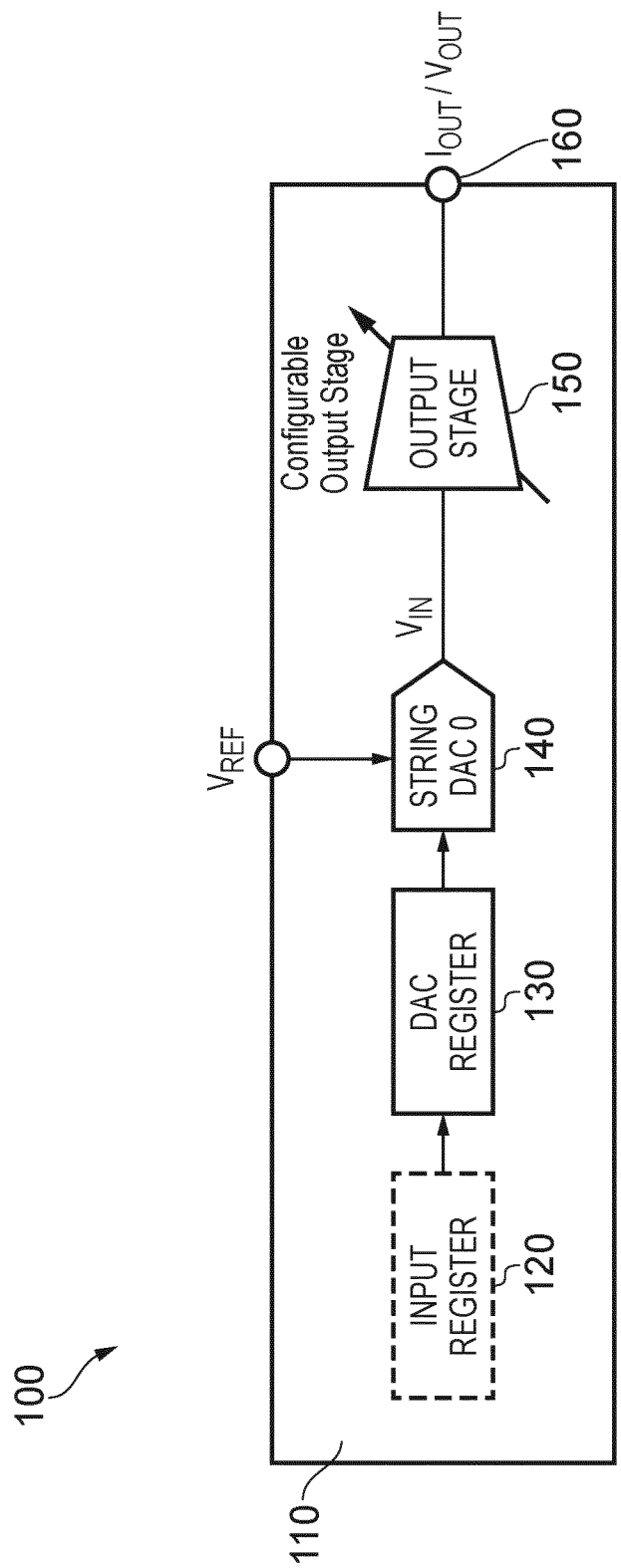
FIG. 1 shows an integrated circuit comprising a DAC channel according to an example of the present disclosure.

FIG. 1 illustrates an integrated circuit (IC) 100 comprising at least one digital-to-analog converter (DAC) channel 110. As described further below, the IC 100 may further comprise a plurality of DAC channels similar to the DAC channel 110. The DAC channel 110 comprises an input register 120, a DAC register 130, a DAC 140, a configurable output stage 150 and an output pin 160. The input register 120 is configured to receive a digital signal. The DAC register 130 is configured to receive the digital signal from the input register 120. The input register 120 and DAC register 130 may double-buffer the digital input signal, so that updates and switching of the DAC 140 can be synchronized across multiple channels by transferring the data from the input registers to the DAC registers substantially simultaneously. This double-buffer functionality is recommended in multi-channel DAC applications but it is not required. Hence, the input register 120 may be optional. The DAC 140 is configured to convert the digital signal to an analog signal VIN and output the analog signal VOUT. The analog signal VIN is a voltage signal. Preferably, the DAC 140 is a string or multi-string DAC. Advantageously, a string or multi-string DAC is useful for lower power, low differential non-linearity (DNL) applications. However, the DAC 140 may alternatively be any other type of DAC known to the skilled person (e.g. binary weighted DAC, R-2R ladder, interpolation DAC, etc.).

The output stage 150 is configured to receive the analog signal VIN, and output a voltage output VOUT or a current output IOUT. In particular, the output stage 150 is configured to operate in a voltage output mode to output the analog signal VIN as a voltage output VOUT. The output stage 150 is further configured to operate in a separate current output mode to output the analog signal VIN as a current output IOUT. In the voltage mode, the output stage 150 may operate to condition, buffer and/or amplify the analog signal VIN to generate and provide the voltage output VOUT. For example, the output stage 150 may function as a voltage buffer and/or amplifier in the voltage mode. In the current mode, the output stage 150 may operate to convert the analog signal VIN into the current signal IOUT using various techniques. For example, in the current mode the output stage may function as a voltage controlled current source (VCCS), a transconductance amplifier (also known as an operational transconductance amplifier (OTA)), or any other type of voltage-to-current converter circuit. As described in more detail below, the output stage 150 is configured such that circuit components of the output stage 150 used in the voltage mode, are also used in the current modes. As such, the output stage 150 comprises components that are shared in both the voltage mode and the current mode.

The output pin 160 is configured to receive the output of the output stage 150 (e.g. a voltage output VOUT or a current output IOUT) for providing the output to external off-chip circuitry.

Although not shown, the IC 100 may comprise a controller and the output stage 150 may be configured to receive control signals from the controller in order to select the operating mode of the output stage 150. A user can provide user input to the controller (e.g. via one or more input terminals to the IC 100, via wireless communications means, or via a module of a system on-chip (SoC) or System in a Package (SiP) architecture of the IC 100) to select the operating mode.

FIG. 2A illustrates a more detailed view of the output stage 150. The output stage 150 comprises a first stage 210, a configurable second stage 220 and a configurable feedback network 230. The first stage 210 comprises a positive input (indicated by "+"), a negative input (indicated by "−") and an output. The first stage 210 is configured to receive the analog signal VIN at its positive input. The first stage 210 is configured to receive an output of the feedback network 230 at its negative input. In some examples, the first stage 210 is or comprises a difference amplifier or an operational amplifier (opamp). The first stage 210 can otherwise be any type of differential amplifier with a differential input. The skilled person will appreciate that the specific design of the first stage 210 may depend on performance requirements of the DAC channel 110 and in particular the DAC 140. As such, the first stage 210 may be designed using best practice and techniques known to skilled person to achieve desired performance requirements of the DAC 140, for example in relation to the DAC's speed, precision, power efficiency and accuracy. Accordingly, in some examples, the first stage 210 may comprise a cascade or combination of internal stages to achieve such requirements. For example, the first stage 210 may a pre-amplifier cascaded with a high-gain difference amplifier or an opamp to achieve performance requirements. Sub-components of the first stage 210 can include an input differential pair, current mirrors and additional cascading sub-stages. The first stage 210 can incorporate resistor degeneration techniques, and/or use feedback (e.g. gain-boosted cascading) techniques for low voltage and high output impedance designs. As one example, the first stage 210 may be provided as detailed in US patent publication U.S. Pat. No. 9,354,644 to achieve temperature drift compensation.

The second stage 220 is arranged between the output of the first stage 210 and the output pin 160. The feedback network 230 is arranged between the second stage 220 and the input of the first stage 210 to provide a feedback loop between the second stage 220 and the first stage 210. In particular, the feedback network 230 provides a feedback loop between the second stage 220 and the negative input of the first stage 210.

The second stage 220 and the feedback network 230 are configurable to provide the voltage output mode and the current output mode of the output stage 150. In particular, the second stage 220 comprises a current output stage 250 including current mode circuitry, and a voltage output stage 240 including voltage mode circuitry. The second stage 220 is configured to present the current output stage 250 or the voltage output stage 240 between the output of the first stage 210 and the output pin 160. Furthermore, the feedback network 230 comprises first feedback circuitry (not shown) for providing feedback to the first stage 210 in the current mode and second feedback circuitry (not shown) for providing feedback to the first stage 210 in the voltage mode. The first feedback circuitry can be considered as part of the current mode circuitry, and the second feedback circuitry can be considered as part of the voltage mode circuitry.

FIG. 2B shows an example of the output stage 150 in the current output mode. In the current output mode, the second stage 220 presents the current output stage 250 between the output of the first stage 210 and the output pin 160. Furthermore, the feedback network 230 presents the first feedback circuitry between the current output stage 250 and the negative input of the first stage 210. As such, the current output stage 250 and first feedback circuitry of the feedback network 230 are provided in the current output mode, such that the first stage 210, the feedback network 230 and the current output stage 250 function together as a voltage-to-current converter, such as a transconductance amplifier, a voltage controlled current source, OTA or otherwise as described above. In some examples, the current output stage 250 can be a reconfigurable transconductance stage, for example as described in US920335062, which can allow the effective transconductance (gm) of the transconductance stage to be varied.

FIG. 2C shows an example of the output stage 150 in the voltage output mode. In the voltage output mode, the second stage 220 presents the voltage output stage 240 between the output of the first stage 210 and the output pin 160. Furthermore, the feedback network 230 presents the second feedback circuitry between the voltage output stage 250 and the negative input of the first stage 210. As such, the voltage output stage 240 and the second circuitry of the feedback network 230 are provided in the voltage output mode, such that the first stage 210, the feedback network 230 and the voltage output stage 250 function together as a voltage buffer and/or voltage amplifier or otherwise as described above.

Advantageously, the same first stage 210 is shared in the output stage 150 between both the current modes and the voltage modes. In other words, with the present arrangement, it is not required to duplicate the components of the first stage 210 or provide multiple first stages for the current and voltage modes. As such, the present arrangement is able to provide a DAC channel with voltage and current output capabilities whilst saving on chip area and power consumption. As described in more detail below, the current output stage 250 and the voltage output stage 240 may also share further components which may lead to corresponding further advantages.

Figure 3A:
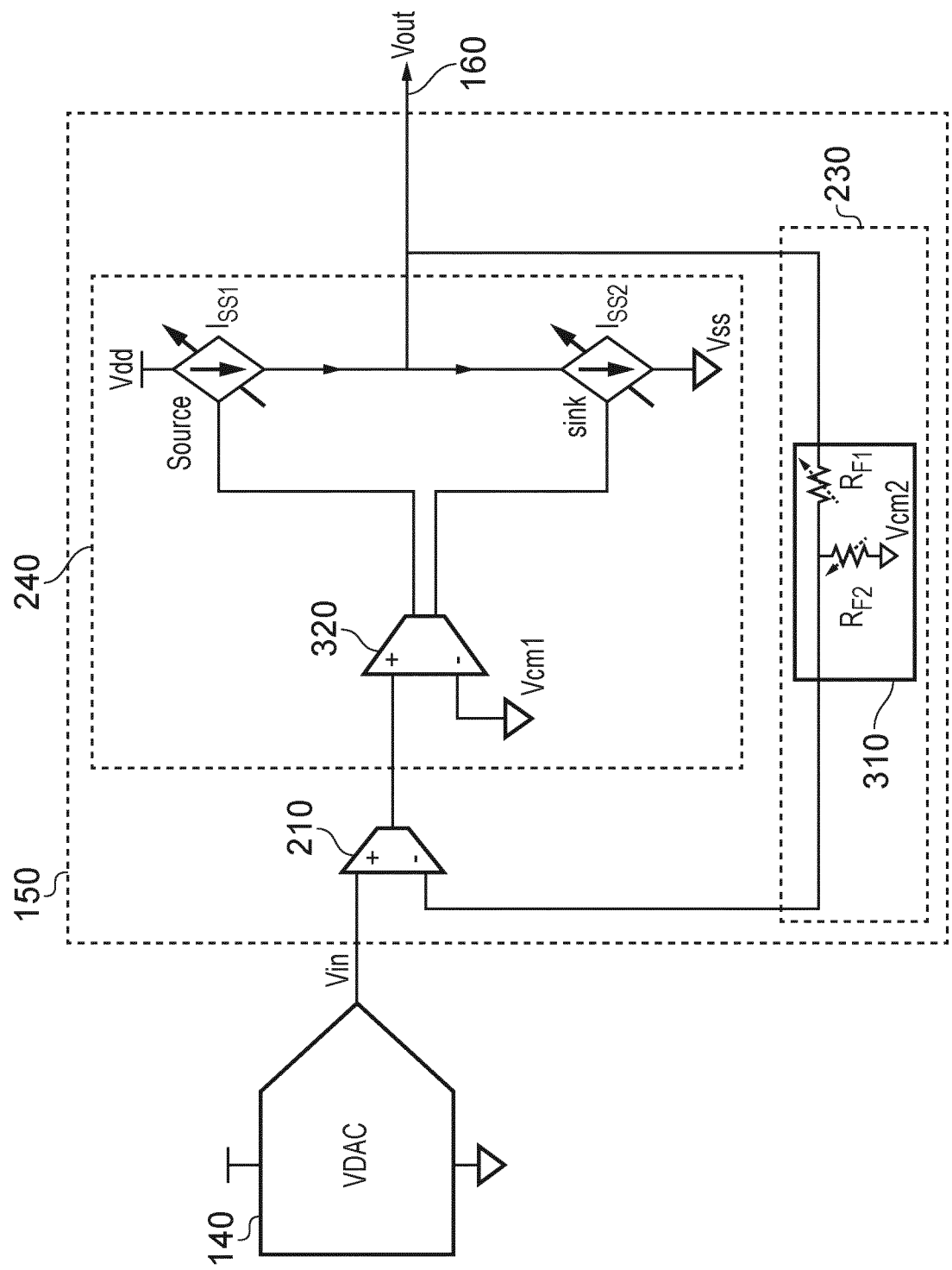
FIG. 3A shows a circuit level view of the output stage of FIGS. 2A and/or 2C in a voltage output mode, according to an example of the present disclosure.

FIG. 3A illustrates a more detailed circuit level view of the voltage output stage 240 and the feedback network 230 of output stage 150 in the voltage mode, according to one example. The voltage output stage 240 comprises a driver 320, a current source ISS1 and a current sink ISS2. The driver 320 is arranged to receive the output of the first stage 210 at a positive input of the driver 320. The negative input to the driver 320 is coupled to a common mode voltage or reference voltage VCM1. The current source ISS1 is coupled between a high rail or supply voltage Vdd and the output pin 160 in order to source or supply current to the output pin 160. The current sink ISS2 is coupled between output pin 160 and a low rail or supply voltage Vss in order to sink current from the output pin 160. The driver 320 is configured to output drive signals to the current source ISS1 and the current sink ISS2 in order to control the current source ISS1 and the current sink ISS2. In particular, the driver 320 is configured to provide drive signals such that the voltage output stage 240 functions as a voltage buffer to provide the voltage output VOUT. Preferably, the voltage output stage 240 functions as a class AB linear buffer. It will be appreciated that the driver 320, the current source ISS1 and the current sink ISS2 may be designed according to any techniques known to the skilled person.

In the voltage output mode, the feedback network 230 provides feedback circuitry 310 in the feedback loop. The feedback circuitry 310 comprises a resistor RF1 coupled in series between the output pin 160 and the negative input of the first stage 210. Preferably, the input to the feedback circuitry 310 (i.e. the input side of the resistor RF1) is coupled as close as possible to the output pin 160. Advantageously, this means that the feedback can account and correct for losses in the signal path up to the output pin 160. The feedback circuitry 310 further comprises a resistor RF2 coupled between the negative input of the first stage 210 and a common mode or reference voltage Vcm2. As such, the resistors of the feedback circuitry 310 are arranged in a non-inverting arrangement to define a closed loop gain of the first stage 210 and therefore the overall gain of the output stage 150 in the voltage output mode. Preferably, the resistors RF1 and RF2 are selected such that the closed loop gain of the output stage 150 is approximately 2. However, any other resistor values may be used. Furthermore, any other suitable closed loop gain can be implemented. A low closed loop gain is preferred because it reduces the presence of input referred error sources. Therefore it will be appreciated that any other suitable gain factor other than 2 can be implemented in the examples of the present disclosure. Moreover, in some examples of the present disclosure, the closed loop gain in the voltage mode can be unity (e.g. 1) in which case the resistors RF2 and RF1 can be omitted. In such examples, the feedback network 230 may simply provide a short circuit between the output 160 and the negative input of the first stage 210.

Preferably, one or both of the resistors RF1 and RF2 are variable resistors such that the gain of the output stage 150 in the voltage output mode can be adjusted or programmed. For example, one or both of RF1 and RF2 may be a digitally variable resistance. Alternatively, one or both of RF1 and RF2 can be an analog variable resistance, e.g. as described in US patent publication US907737662. A digitally variable resistance may be achieved with a switchable combination of internal series and/or parallel resistors, or any other arrangement of a digital potentiometer, rheostat or programmable impedance for example as described in U.S. Pat. No. 9,583,241B. More generally, a variable resistance can be achieved by providing a combination of two or more internal resistors. One or more of the internal resistors can be tunable over a range of resistance to fine tune the resistance, whilst the other internal resistors have static or fixed resistance. Alternatively, the feedback resistors RF1 and RF2 are static or fixed resistors. Vcm2 may be the same as Vcm1 or Vss. Alternatively, Vcm2 may be different to Vcm1 and Vss.

Figure 3B:
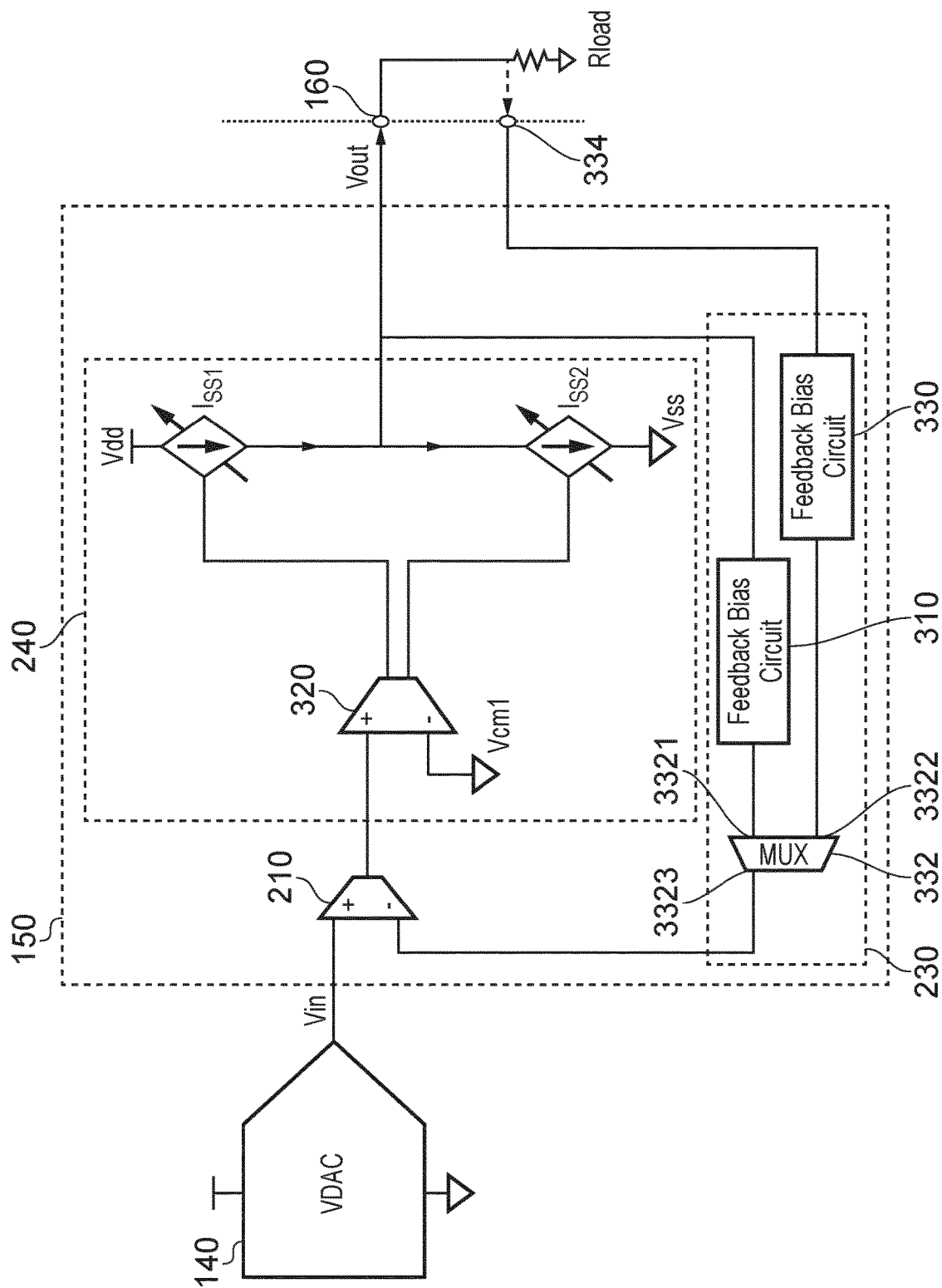
FIG. 3B shows a circuit level view of the output stage of FIGS. 2A and/or 2C in a voltage output mode with an external feedback loop, according to a further example of the present disclosure.

FIG. 3B illustrates a more detailed circuit level view of the voltage output stage 240 and the feedback network 230 of the output stage 150 in the voltage mode, according to another example. The arrangement of FIG. 3B is similar to that of FIG. 3A with the following differences. The feedback network 230 comprises a multiplexer (MPX or MUX) 332, a first feedback circuit 310 and a second feedback circuit 330. The first feedback circuit 310 is coupled between the output pin 160 and a first input 3321 of the MUX 332.

The first feedback circuit 310 corresponds to the feedback circuit 310 described in FIG. 3A. The second feedback circuit 330 is coupled between an additional output pin 334 of the IC 100 and a second input 3322 of the MUX 332. The second feedback circuit 330 may comprise circuitry similar to the first feedback circuit 310. The output of the MUX 332 is coupled to the negative input of the first stage 210. The multiplexer 332 is configured to couple the first input 3321 to the output 3323 in a first mode and couple the second input 3322 to the output 3323 in a second mode. As such, there is provided a first feedback path from the output pin 160 to the negative input of the first stage 210 via the first feedback circuitry 310 when the MUX 332 is in the first mode, and a second feedback path from the pin 334 to the negative input of the first stage 210 via the second feedback circuitry 330 when the MUX 332 is in the second mode.

In operation, the output pin 160 may be coupled to a load represented by the resistance Rload. However, resistances along the signal path between the output pin 160 and Rload may cause power losses. Voltage loss may cause a slightly different output signal VOUT to reach the load Rload e.g. due to the presence of series impedance causing a voltage drop, (series I*R drop). Advantageously, the additional output pin 223 can be coupled closer to the load Rload. By selecting the second mode of the MUX 332, the feedback path provided by the feedback network 230 will include the lossy path between the output pin 160 and the load Rload. Consequently, the losses can be accounted and corrected for by the output stage 150. In particular, the impact of the IR voltage drop will be divided by the open loop gain of the first stage 210, at least whilst the first stage 210 remains in its normal operating range.

Alternatively, the MUX 332 can be operated in its first mode, in which case the output stage 150 illustrated in FIG. 3B will be functionally equivalent to the output stage described in respect of FIG. 3A.

Although FIG. 3B shows separate feedback circuits 310 and 330, in some examples the feedback path between the output pin 160 and the MUX input 3321 and the feedback path between the output pin 334 and the MUX input 3322 may share the same feedback network.

In some examples, the second feedback circuit 330 may be omitted and the output pin 334 may couple directly to the second MUX input 3322.

Figure 3C:
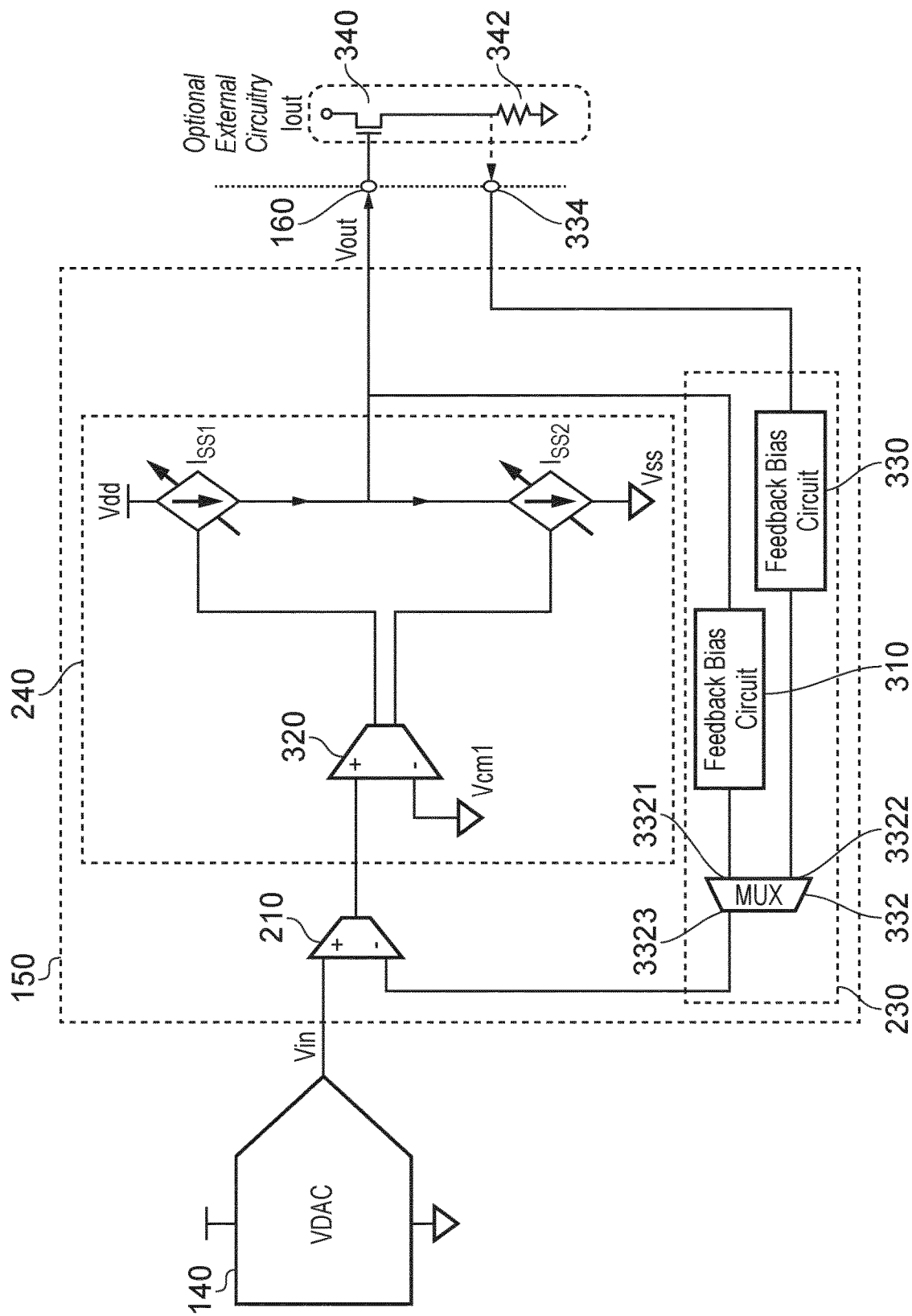
FIG. 3C shows a circuit level view of the output stage of FIGS. 2A and/or 2C in a voltage output mode coupled with an external current mode arrangement, according to a further example of the present disclosure.

FIG. 3C illustrates an optional use of the output stages illustrated in FIGS. 3A and 3B for an external current output mode. As shown, the output pin 160 may be coupled to the gate of an external MOS transistor 340. The source of the transistor 340 may be coupled to an external resistance 342. The output VOUT of the output stage 150 may drive the gate of the transistor 340 such that the transistor 340 outputs an external current IOUT. As such, the voltage mode of the output stage 150 can be used to provide an external current mode to generate an external current IOUT. This is advantageous where a high current output is required and it is not desirable to generate such high currents on-chip.

This also avoids high power consumption and dissipation on-chip. It is also advantageous to enable a user to select external components (e.g. transistor and resistor) values to achieve and tolerate a specific target output current and the consequent power dissipation, without requiring any change to the IC 100.

Optionally, the pin 334 can couple to the source of the transistor 340 and the MUX 332 can operate in the second mode. Advantageously, this can achieve reduced $I^2*R$ power losses in the signal path between the pin 160 and the resistance 342 similar to the effect described in relation to FIG. 3B. Alternatively, the MUX 332 can operate in the first mode.

Although the feedback network of FIG. 3B is shown in FIG. 3C, it should be appreciated that the simpler feedback network of FIG. 3A may be employed.

FIG. 4A illustrates a more detailed view of the current output stage 250 and the feedback network 230 of the output stage 150 in the current mode, according to one example. The current output stage 250 comprises a NMOS transistor 420 and a resistor 410. The transistor 420 comprises a gate coupled to the output of the first stage 210, a drain coupled to the output pin 160 and a source coupled to the resistor 410. The resistor 410 is coupled between the source of the transistor 420 and a reference or common mode voltage VCM. In the current mode, the feedback network 230 provides a short circuit connection between the negative input to the first stage 210 and the source of the transistor 420.

In operation, the first stage 210 in combination with the transistor 420 and the resistor 410, will behave as a transconductance amplifier. In particular, the output of the first stage 210 will drive the gate of the transistor 420, and the transistor 420 will sink a current Isink that is proportional to the analog input VIN, therefore converting the analog signal VIN into an output current IOUT. As such, the current mode illustrated in FIG. 4A may be referred to as a current sink mode.

As shown in FIG. 4A, the resistor 410 may preferably be a variable resistor, such as a analog or a digitally variable resistor, as previously described above. Advantageously, this may enable the user to digitally or otherwise select the output current level or gain. However, in some examples, the resistor 410 can be static or fixed to reduce circuit complexity and area.

As will be described in more detail below, components of the current output stage 250 may be shared with the voltage output stage 240. For example, the transistor 420 and the resistor 410 may be used in both the current output stage 250 as shown in FIG. 4A, and in the current sink ISS2 illustrated in FIGS. 3A-3C.

Figure 4B:
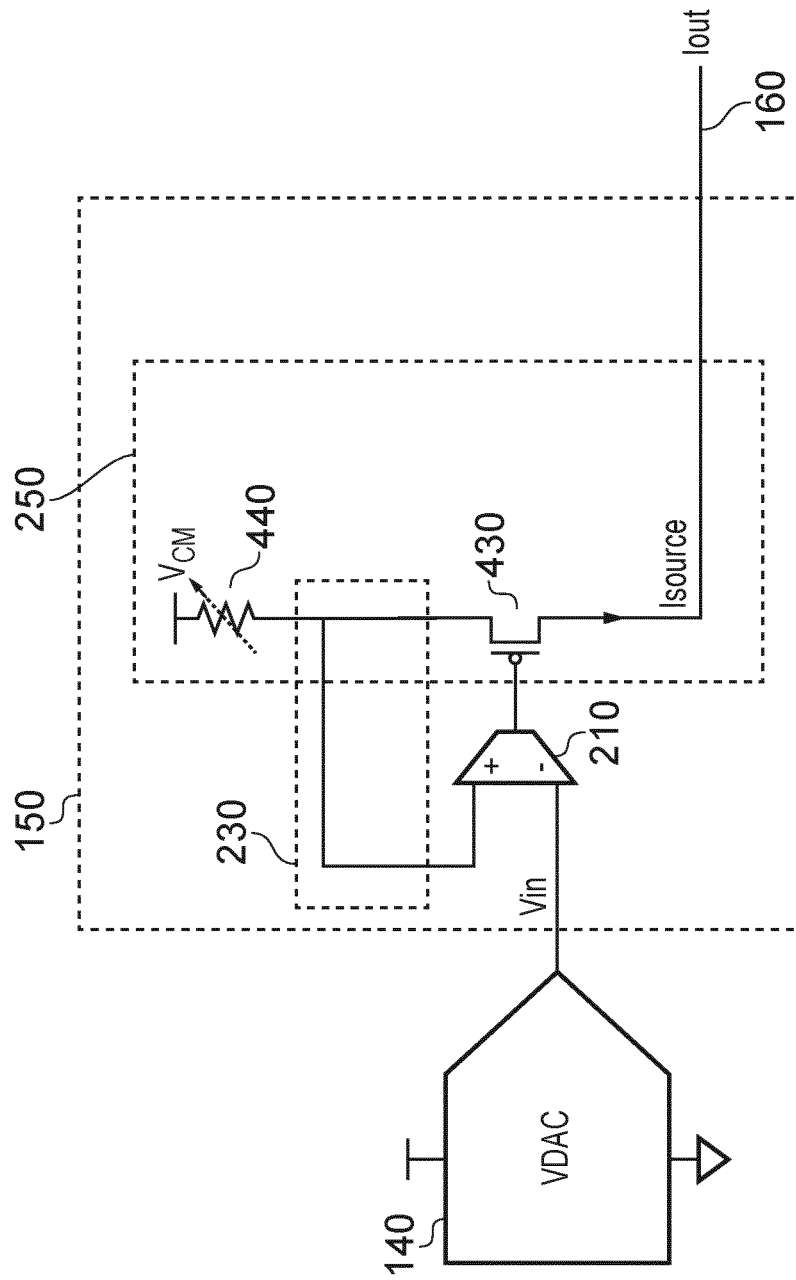
FIG. 4B shows a circuit level view of the output stage of FIGS. 2A and/or 2B in a current source output mode, according to an example of the present disclosure.

FIG. 4B illustrates a more detailed view of the current output stage 250 and the feedback network 230 of the output stage 150 in the current mode, according to another example. The current output stage illustrated in FIG. 4B is similar to that which is illustrated in FIG. 4A, but instead uses a PMOS transistor 430. The gate of the transistor 430 is coupled to the output of the first stage 210. The drain of the transistor 430 is coupled to the output pin 160. The source of the transistor 430 is coupled to the resistor 440. The resistor 440 is coupled between the source of the transistor 430 and a common mode or reference voltage VCM. In the current mode, the feedback network 230 provides a short circuit connection between the negative input to the first stage 210 and the source of the transistor 430.

In operation, the first stage 210 in combination with the transistor 430 and the resistor 440, will behave as a transconductance amplifier. In particular, the output of the first stage 210 will drive the gate of the transistor 430, the transistor 430 will source or supply a current Isource to the output pin 160 which is proportional to the analog input VIN, therefore converting the analog signal VIN into an output current IOUT. As such, the current mode illustrated in FIG. 4B may be referred to as a current source mode.

Preferably the resistor 440 is a variable resistor such as an analog or a digitally variable resistor, as previously described above. Alternatively the resistor 440 may be static.

As will be described in more detail below, components of the current output stage 250 may be shared with the voltage output stage 240. For example, the transistor 430 and the resistor 440 may be used in both the current output stage 250 as shown in FIG. 4B and in the current source ISS1 illustrated in FIGS. 3A-3C.

As explained further below, the output stage 150 may be configured to provide both a current sink mode as shown in FIG. 4A, and a current source mode as shown in FIG. 4B, as well as a voltage output mode as shown in FIGS. 3A-3C.

Figure 5:
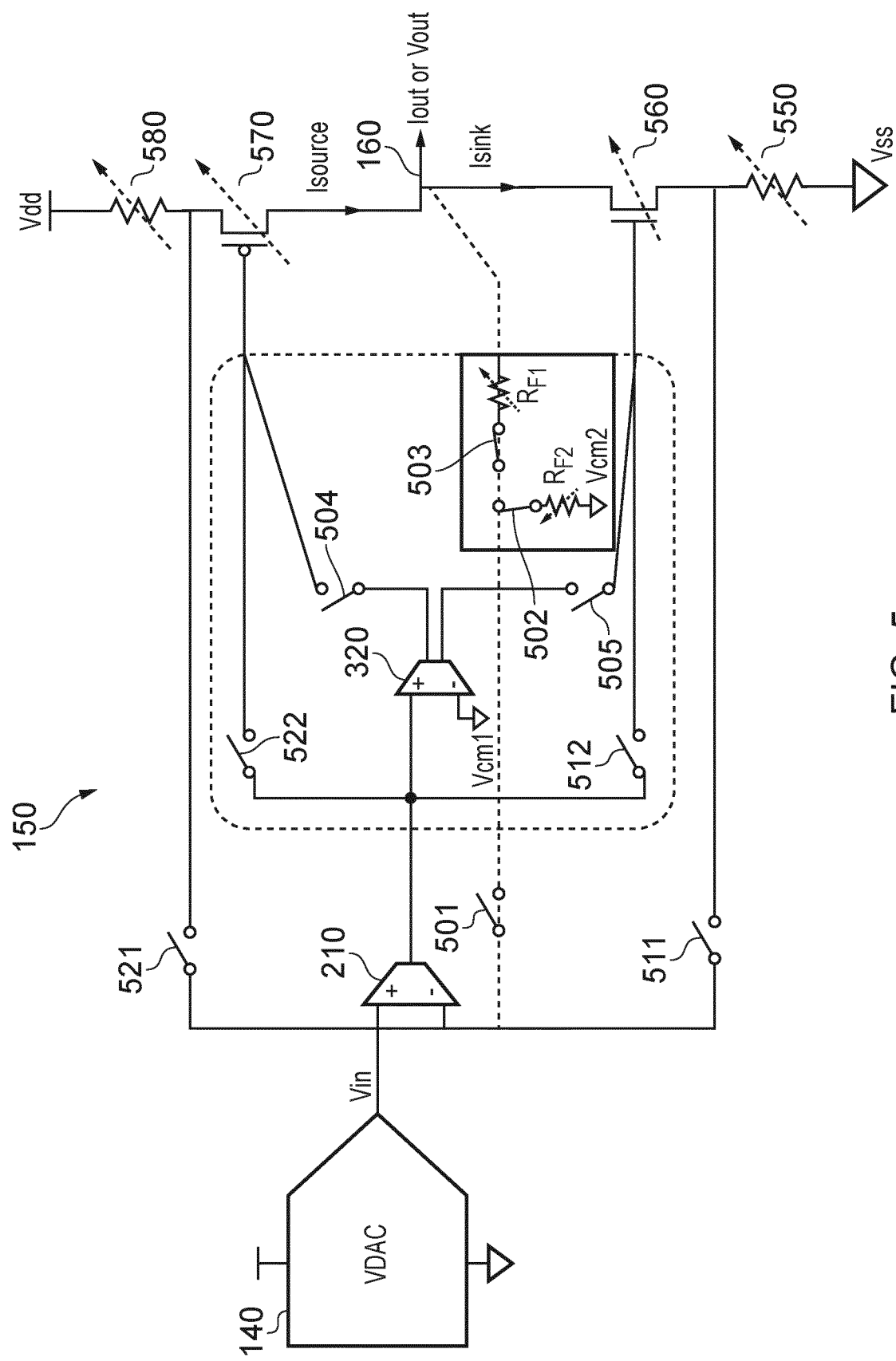
FIG. 5 shows a combined circuit level view of the output stage of FIG. 2A that is configurable between a current source mode, a current sink mode and a voltage source mode, according to an example of the present disclosure.

FIG. 5 illustrates a configurable output stage 150 configured to operate in a voltage output mode, current sink mode and a current source mode, according to one example. The output stage 150 comprises a first stage 210 as previously described above. The output stage 150 further comprises a NMOS transistor 560 and a first output resistor 550. A drain of the transistor 560 is coupled to the output pin 160. A source of the transistor 560 is coupled to the first output resistor 550. The first output resistor 550 is coupled between the source of the transistor 560 and a low supply voltage VSS. The output stage 150 also comprises a PMOS transistor 570 and a second output resistor 580. A drain of the transistor 570 is coupled to the output pin 160. A source of the transistor 570 is coupled to the second output resistor 580. The second output resistor is coupled between the source of the transistor 570 and an upper supply voltage VDD. Preferably, the output resistors 570 and 580 may be variable (e.g. digitally variable) to provide more user configurability. Alternatively, the output resistors 570 and 580 may be static or fixed to reduce circuit area and complexity.

The positive input of the first stage 210 is coupled to the output of the DAC 140 to receive the analog signal VIN. The negative input of the first stage 210 is coupled to the source of the PMOS transistor 570 via a switch 521. The negative input of the first stage 210 is also coupled to the source of the NMOS transistor 560 via a switch 511. Furthermore, the negative input of the first stage 210 is coupled to a first side of a switch 501. A second side of the switch 501 is coupled to the output pin 160 via a switch 503 and a first feedback resistor RF1 provided in series. Furthermore, the second side of the switch 501 is also coupled to a common mode or reference voltage VCM2 via a switch 502 and a second feedback resistor RF2 provided in series. Preferably, the feedback resistors RF1 and RF2 are variable or digitally programmable. Alternatively, the feedback resistors RF1 and RF2 may be static or fixed.

The output of the first stage 210 is coupled to a gate of the PMOS transistor 570 via a switch 522. The output of the first stage 210 is also coupled to a gate of the NMOS transistor 560 via a switch 512.

Furthermore, the output stage 150 also comprises a driver 320 as previously described above. The output of the first stage 210 is coupled to the positive input of the driver 320. The negative input of the driver is coupled to a common mode or reference voltage VCM1. A first output of the driver 320 is coupled to the gate of the PMOS transistor 570 via a switch 504. A second output of the driver 320 is coupled to the gate of the NMOS transistor 560 via a switch 505.

In a voltage output mode of the output stage 150, switches 511, 512, 521 and 522 are open. Switches 501, 502, 503, 504, 505 are closed. By this switch configuration, the output stage 150 illustrated in FIG. 5 is functionally equivalent to the output stage 150 shown in FIG. 3A. In particular, the first stage 210 amplifies the analog signal VIN by a closed loop gain determined by the values of RF1 and RF2. Preferably, RF1 and RF2 are selected or programmed such that the gain is approximately 2. However, the closed loop gain can be any other suitable value, including unity, as discussed above. Furthermore, the driver 320 drives the gates of the transistors 570 and 550 such that the driver 320, the transistors 560 and 570 and the resistors 550 and 580 function as a class AB buffer to output the voltage signal VOUT. VOUT may be viewed as a closed loop amplified and buffered version of VIN. The PMOS transistor 570 and the output resistor 580 may be viewed as an implementation of the current source ISS1 in FIG. 3A, and the NMOS transistor 560 and the output resistor 550 may be viewed as an implementation of the current sink ISS2 in FIG. 3A.

In a current sink mode of the output stage 150, switches 501, 502, 503, 504, 505, 521 and 522 are open. Switches 511 and 512 are closed. By this switch configuration, the output stage 150 illustrated in FIG. 5 is functionally equivalent to the output stage 150 illustrated in FIG. 4A. In particular, the transistor 560, resistor 550 and the lower supply voltage Vss in FIG. 5, may correspond to the transistor 420, resistor 410 and the common mode voltage VCM illustrated in FIG. 4A. As such, in the current sink mode, the first stage 210 in combination with the transistor 560 and the resistor 550 will behave as a transconductance amplifier. In particular, the output of the first stage 210 will drive the gate of the transistor 560, the transistor 560 will sink a current Isink from the output pin 160 that is proportional to the analog input VIN, therefore converting the analog signal VIN into an output current IOUT.

In a current source mode of the output stage 150, switches 501, 502, 503, 504, 505, 511 and 512 are open. Switches 521 and 522 are closed. By this switch configuration, the output stage 150 illustrated in FIG. 5 is functionally equivalent to the output stage 150 illustrated in FIG. 4B. In particular, the transistor 570, resistor 580, and the upper supply voltage VDD in FIG. 5, may correspond to the transistor 430, resistor 440 and common mode voltage VCM illustrated in FIG. 4B. As such, in the current source mode, the first stage 210 in combination with the transistor 570 and the resistor 580 will behave as a transconductance amplifier. In particular, the output of the first stage 210 will drive the gate of the transistor 570, the transistor 570 will source or supply a current Isource to the output pin 160 that is proportional to the analog input VIN, therefore converting the analog input signal VIN into an output current IOUT.

The voltage mode feedback circuit has three switches 501, 502 and 503 (i.e. three-state capability) so that when the output stage 150 is changed to one of the current modes, feedback resistors RF1 and RF2 present substantially no load at the output pin 160. The voltage mode feedback network contains the at least one series switch (503) to achieve this. However, preferably as shown, the feedback network has two switches (502 and 503) coupled to the feedback point so that they are substantially at the same common-mode level. The switch 502 and 503 impedances can therefore be matched with appropriate scaling, and their impact on the feedback factor is substantially reduced when operating in the voltage mode. The switches 502 and 503 should also preferably be low off-leakage switches.

Although not shown, the IC 100 may comprise a controller and the switches in the output stage 150 may be configured to receive control signals from the controller in order to control the switches, such that the output stage 150 can operate in the voltage mode, current sink mode and current source mode as described above. A user can provide user input to the controller (e.g. via one or more input terminals to the IC 100, via wireless communications means, or via a module of a system on-chip (SoC) or System in a Package (SiP) architecture of the IC 100) to select the voltage mode, current sink mode or current source mode.

Advantageously, the output stage 150 shown in FIG. 5 is able to provide a voltage output mode, current sink mode and current source mode by sharing the same first stage 210 and sharing the same resistors 550/580 and transistors 560/580. Sharing the first stage 210 between modes can lead to space and power savings as described above. Furthermore, the output transistors 560 and 570 are typically large in area in order to reliably provide the class AB buffer functionality in the voltage mode and the transconductance functionality in the current source and sink modes. As such, re-using the same transistors 560 and 570 in the current and voltage modes offers significant space savings on-chip.

Although not illustrated in FIG. 5, it will be appreciated that the output stage of Figure may be adapted to include the additional circuitry of FIG. 3B or 3C for use in the voltage mode. In particular, the output stage of FIG. 5 may be adapted to include a multiplexer 332 that multiplexes an alternative feedback path from another device pin 334, as shown in FIGS. 3B and 3C and described above.

It should be appreciated that the configuration of FIG. 5 is one example of how the output stage 150 may be switched and/or multiplexed to provide the voltage and current mode functionalities described in relation to FIGS. 3A-4B, and other equivalent configurations are within the scope of this disclosure.

Figure 6A:
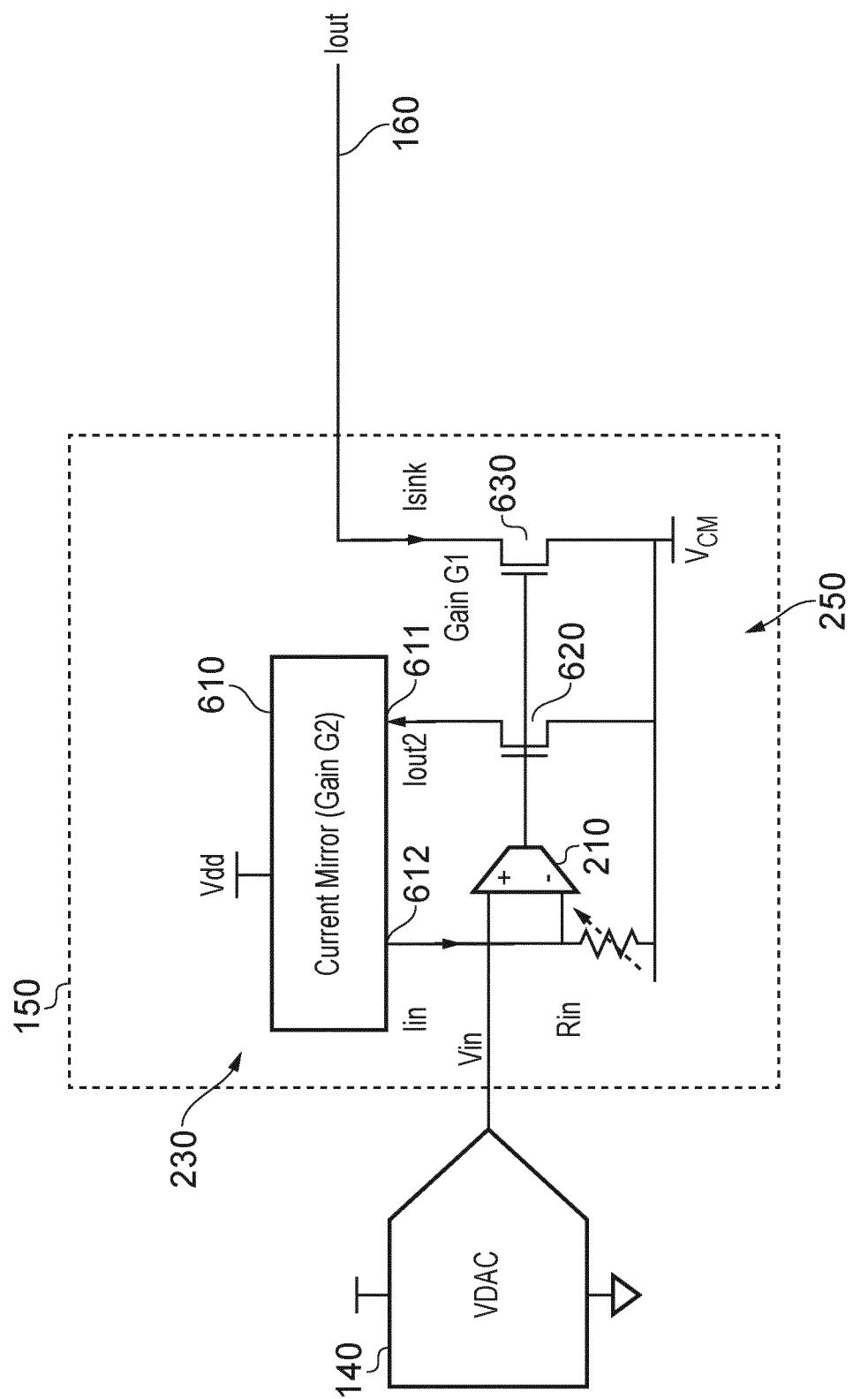
FIG. 6A shows a circuit level view of the output stage of FIGS. 2A and/or 2B in a current sink output mode, according to a further example of the present disclosure.

FIG. 6A shows a view of an output stage 150 in a current sink mode according to a further example. The output stage 150 comprises NMOS transistors 620 and 630, a current mirror 610 and a resistor Rin. The resistor Rin is preferably variable, configurable or programmable (e.g. analog or digitally) as previously discussed above. Alternatively, the resistor Rin may be a static or fixed resistance.

A gate of the transistor 620 is coupled to the output of the first stage 210. A source of the transistor 620 is coupled to a common mode or reference voltage VCM. A drain of the transistor 630 is coupled to an input 611 of the current mirror 610. A gate of the transistor 630 is also coupled to the output of the first stage 210. A source of the transistor 630 is also coupled to the common mode or reference voltage VCM. A drain of the transistor 630 is coupled to the output pin 160. The resistor Rin is coupled between the negative input to the first stage 210 and the common mode or reference voltage VCM. Furthermore, negative input of the first stage 210 is also coupled to an output 612 of the current mirror. The current mirror is also coupled to an upper supply voltage VDD to power the current mirror.

The current mirror 610 is configured to receive a current at its input 611 and output a mirrored current at its output 612. For example, the mirrored current may be substantially the same current as the inputted current. In some examples, the current mirror 610 is configured to mirror the current by a gain or ratio of "G2", such that the mirrored current is the input current multiplied by G2. This is achieved using best practice current mirror circuit and layout design techniques. The current mirror gain, or replication ratio, may also be digitally variable with configurable current mirror using unit devices, known to those skilled in the art.

In operation, the transistor 620 draws a current Iout2 at its drain in response to the output of the first stage 210 driving the gate of the transistor 620. The current mirror receives the current Iout2 at its input 611. The current mirror 610 then outputs a mirrored current Iin at its output 612, which is supplied to the resistor Rin. As such, the first stage 210 in combination with the current mirror 610, resistor Rin, and the transistor 620 will behave as a transconductance amplifier to convert the analog signal Vin into a current Iout2. Since the output of the first stage 210 is also coupled to the gate of the transistor 630 and the source of the transistor 630 is also coupled to VCM, an output current Iout is supplied by the drain of the transistor 630 which mirrors Iout2. In particular, the transistor 630 sinks a current Isink in order to provide the output current Iout at the output pin 160, where Iout is proportional to Vin. In some examples, transistor 630 may be configured to provide a gain or ratio of G1 between the transistor 620 and the transistor 630, such that the output current Iout is Iout2*G1.

Figure 6B:
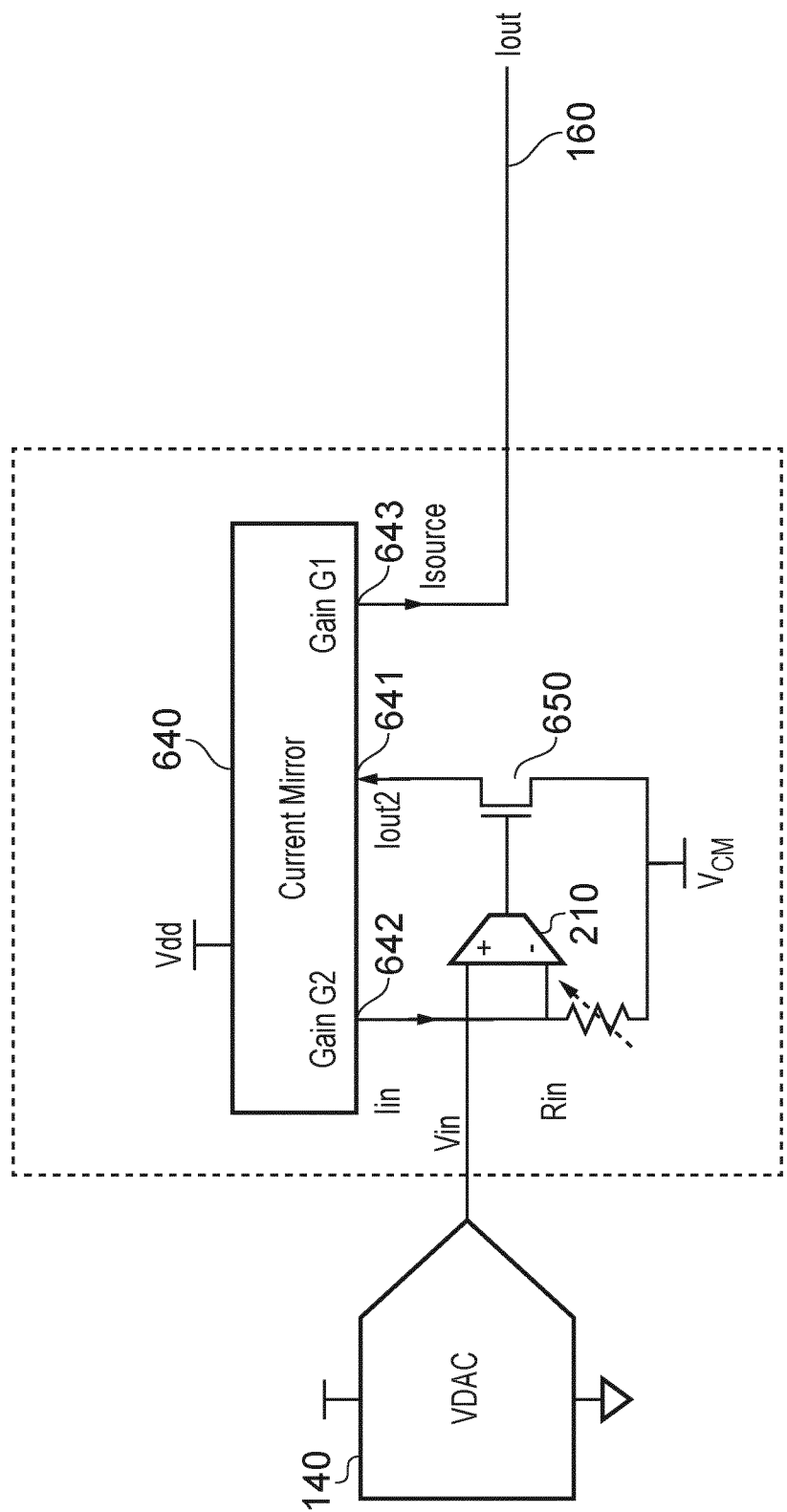
FIG. 6B shows a circuit level view of the output stage of FIGS. 2A and/or 2B in a current source output mode, according to a further example of the present disclosure.

FIG. 6B shows a view of an output stage 150 in a current source mode according to a further example. The output stage 150 comprise a NMOS transistor 650, a current mirror 640 and a resistor Rin. The resistor Rin is preferably variable, programmable (e.g. analog or digitally) or configurable as previously discussed above. Alternatively, the resistor Rin may be a static resistance.

A gate of the transistor 650 is coupled to the output of the first stage 210. A source of the transistor 650 is coupled to a common mode or reference voltage VCM. A drain of the transistor 650 is coupled to an input 641 of the current mirror 640. A first output 642 of the current mirror 640 is coupled to the negative input to the first stage 210. A second output 643 of the current mirror 640 is coupled to the output pin 160. The resistor Rin is coupled between the negative input to the first stage 210 and the common mode or reference voltage VCM.

The current mirror 640 is configured to receive a current at its input 641 and output a mirrored current at its outputs 642 and 643. For example, the mirrored currents may be substantially the same current as the inputted current. In some examples, the first output 642 of the current mirror 640 is configured to output a mirrored current with a gain or ratio of G2, such that the outputted current is the inputted current multiplied by G2. Furthermore, in some examples, the second output 643 of the current mirror 640 is configured to output a mirrored current with a gain or ratio of G1, such that the outputted current is the inputted current multiplied by G1. G1 and G2 may be different or the same. Similar to G2 described in relation to FIG. 6A, the gain or replication ratio G1 may also be varied digitally.

In operation, the transistor 650 draws a current Iout2 at its drain in response to the output of the first stage 210 driving the gate of the transistor 650. The current mirror receives the current Iout2 at its input 641. The current mirror 640 then outputs a mirrored current Iin at its output 642, which is supplied to the resistor Rin. Furthermore, the current mirror also outputs a mirrored current Isource at its output 643 to supply an output current to the output pin 160. As such, the first stage 210 in combination with the current mirror 640, resistor Rin and the transistor 650 will behave as a transconductance amplifier to convert the analog signal VIN into an output current. In particular, the current mirror 640 sources or supplies a current Isource in order to provide the output current Iout which is proportional to Vin.

Figure 7A:
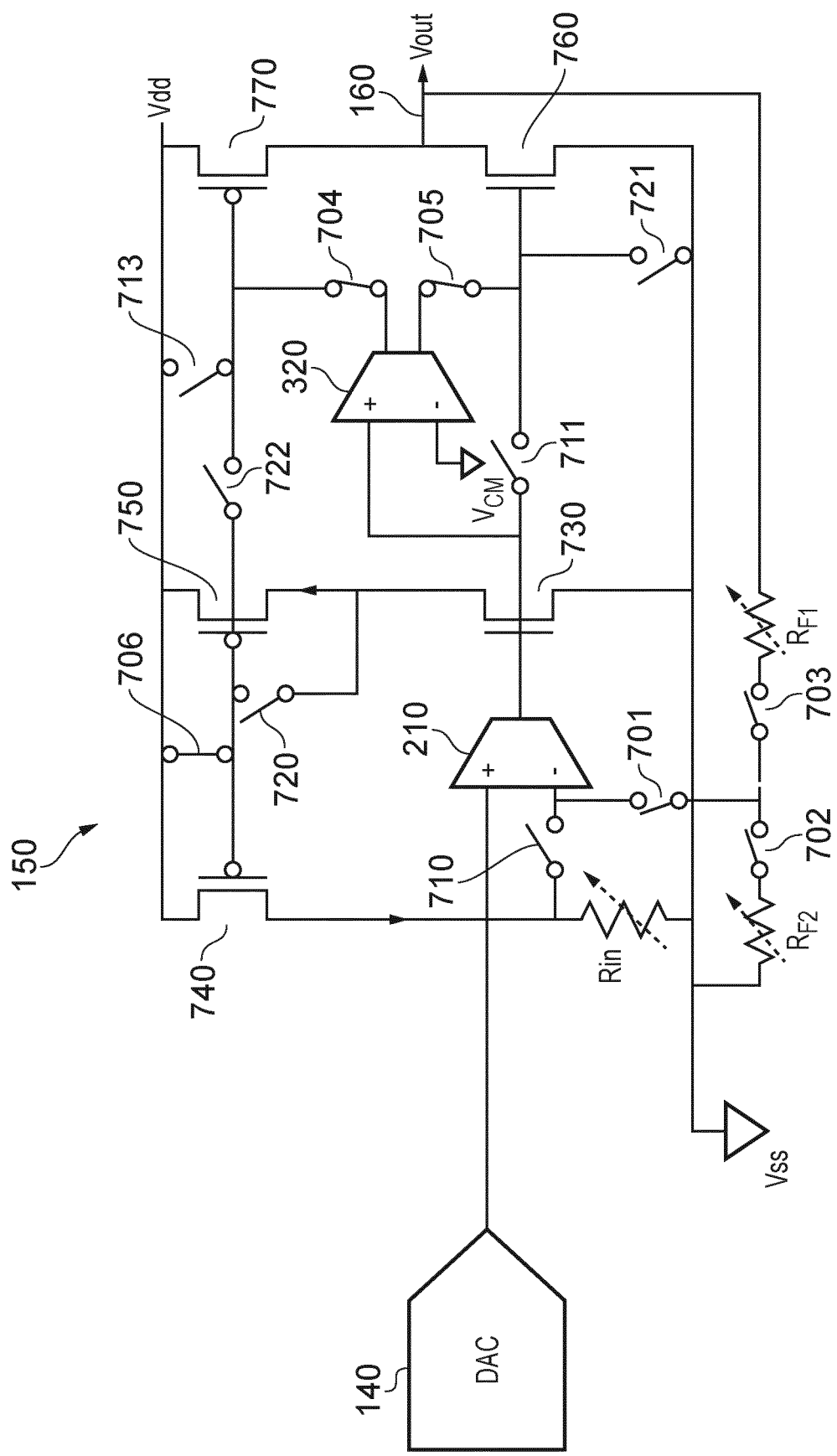
FIGS. 7A-7C show a combined circuit level view of the output stage of FIG. 2A that is configurable between a current source mode, a current sink mode and a voltage source mode, according to a further example of the present disclosure.

FIG. 7A illustrates a configurable output stage 150 configured to operate in a voltage output mode, a current sink mode and a current source mode, according to a further example. The output stage 150 comprises a first stage 210 as previously described above. The output stage 150 further comprises a NMOS transistor 760 and a PMOS transistor 770. A source of the transistor 760 is coupled to a low supply voltage VSS. A drain of the transistor 760 is coupled to the output pin 160. A gate of the transistor 760 is coupled to the low supply VSS via a switch 721. A source of the transistor 770 is coupled to an upper supply voltage VDD. A drain of the transistor 770 is coupled to the output pin. A gate of the transistor 770 is coupled to the upper supply via a switch 713.

The positive input of the first stage 210 is coupled to the output of the DAC 140 to receive the analog signal VIN. The negative input of the first stage 210 is coupled to a first side of a switch 710. A resistor Rin is coupled between a second side of the switch 710 and the lower supply voltage VSS. The negative input to the first stage 210 is also coupled a first side of a switch 701. A second side of the switch 701 is coupled to the output pin 760 via a switch 703 in series with a first feedback resistor 703. The second side of the switch 701 is coupled to the lower supply VSS via a switch 702 in series with a second feedback resistor 702. Preferably, the feedback resistors RF1 and RF2 are variable or programmable (e.g. analog or digitally) as previously described. Alternatively, the feedback resistors RF1 and RF2 may be static. As before, the voltage feedback network is arranged to present a high impedance path when disabled and to substantially cancel out the on-resistance artefact of the series switches, which should have low off-leakage capability.

The output stage 150 comprises a driver 320 as previously described above. The output of the first stage 210 is coupled to the positive input of the driver 320. The negative input of the driver is coupled to a common mode or reference voltage VCM. A first output of the driver 320 is coupled to the gate of the PMOS transistor 770 via a switch 704. A second output of the driver 320 is coupled to the gate of the NMOS transistor 760 via a switch 705. The output of the first stage 210 is also coupled to the gate of the transistor 760 via a switch 711.

The output stage 150 further comprises PMOS transistors 740, 750 and an NMOS transistor 730. A source of the transistor 740 is coupled to the upper supply VDD. A drain of the transistor 740 is coupled to the second side of the switch 710. A source of the transistor 750 is coupled to the upper supply Vdd. A drain of the transistor 750 is coupled to a drain of the transistor 730. A source of the transistor 730 is coupled to the lower supply VSS. A gate of the transistor 730 is coupled to the output of the first stage 210. A gate of the transistor 740 is coupled to the gate of the transistor 750. Furthermore, the gates of both the transistors 740 and 750 are coupled to the upper supply via a switch 706. The gate of the transistor 750 is coupled to its drain via a switch 720. The gates of the transistors 740 and 750 are also coupled to the gate of the transistor 770 via a switch 722.

In FIG. 7A, the switches are illustrated in a voltage mode configuration. In the voltage output mode of the output stage 150, switches 701, 702, 703, 704, 705 and 706 are closed. The other switches 710, 711, 721, 713, 722, 720 are open. By this switch configuration, the output stage 150 illustrated in FIG. 7A is functionally equivalent to the output stage 150 shown in FIG. 3A. In particular, the first stage 210 amplifies the analog signal VIN by a closed loop gain determined by the values of RF1 and RF2. Preferably, RF1 and RF2 are selected such that the gain is approximately 2. However, the closed loop gain can be any other suitable value, including unity, as discussed above. Furthermore, the driver 320 drives the gates of the transistors 770 and 760 such that the driver 320, the transistors 760 and 770 function as a class AB buffer to output the voltage signal VOUT. VOUT may be viewed as an amplified and buffered version of VIN. The PMOS transistor 770 may be viewed as an implementation of the current source ISS1 in FIG. 3A, and the NMOS transistor 760 may be viewed as an implementation of the current sink ISS2 in FIG. 3A.

Figure 7B:
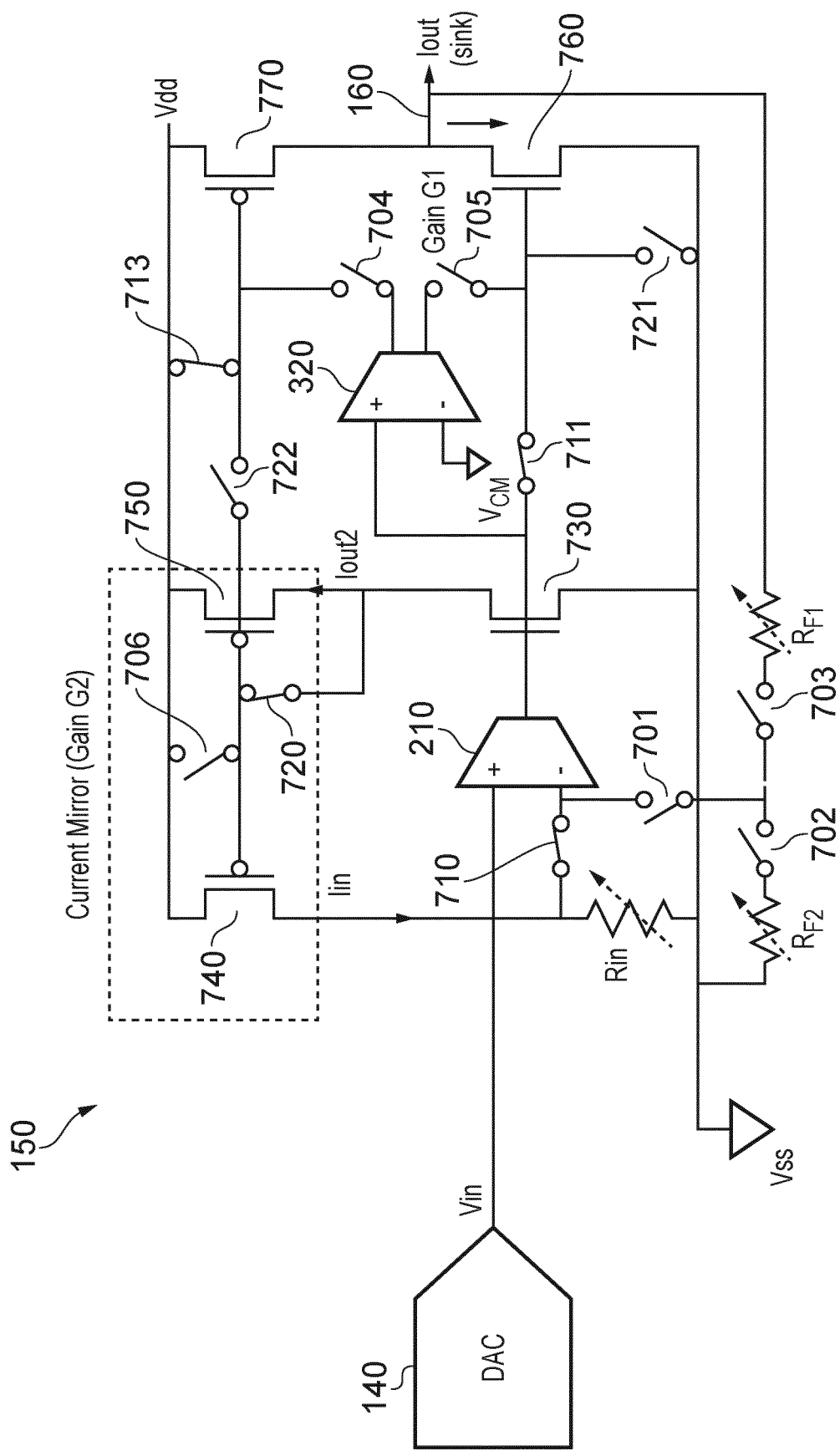

FIG. 7B shows the output stage 150 of FIG. 7A, but with the switches provided in a current sink configuration. In the current sink mode, switches 710, 711, 713, 720 are closed. Switches 701, 702, 703, 704, 705, 721, 706, 722 are open. By this switch configuration, the output stage 150 illustrated in FIG. 7B is functionally equivalent to the output stage 150 illustrated in FIG. 6A. The transistors 730 and 760 in FIG. 7B may correspond to the transistors 620 and 630 in FIG. 6A. The lower supply VSS in FIG. 7B may correspond to the VCM in FIG. 6A. The resistor Rin in FIG. 7B may correspond to the resistor Rin in FIG. 6A. Furthermore, the transistors 740 and 750 in FIG. 7B may form the current mirror 610 in FIG. 6A, whereby the drains of transistors 750 and 740 in FIG. 7B correspond to the input 611 and output 612 in FIG. 6A, respectively. As such, the first stage 210 in combination with the transistors 740/750, resistor Rin, and the transistor 730 will behave as a transconductance amplifier to convert the analog signal Vin into an output current. Since the output of the first stage 210 is also coupled to the gate of the transistor 760 in the current sink mode, the output current is supplied by the drain of the transistor 760. In particular, the transistor 760 sinks a current Isink in order to provide the output current Iout at the output pin 160.

Figure 7C:
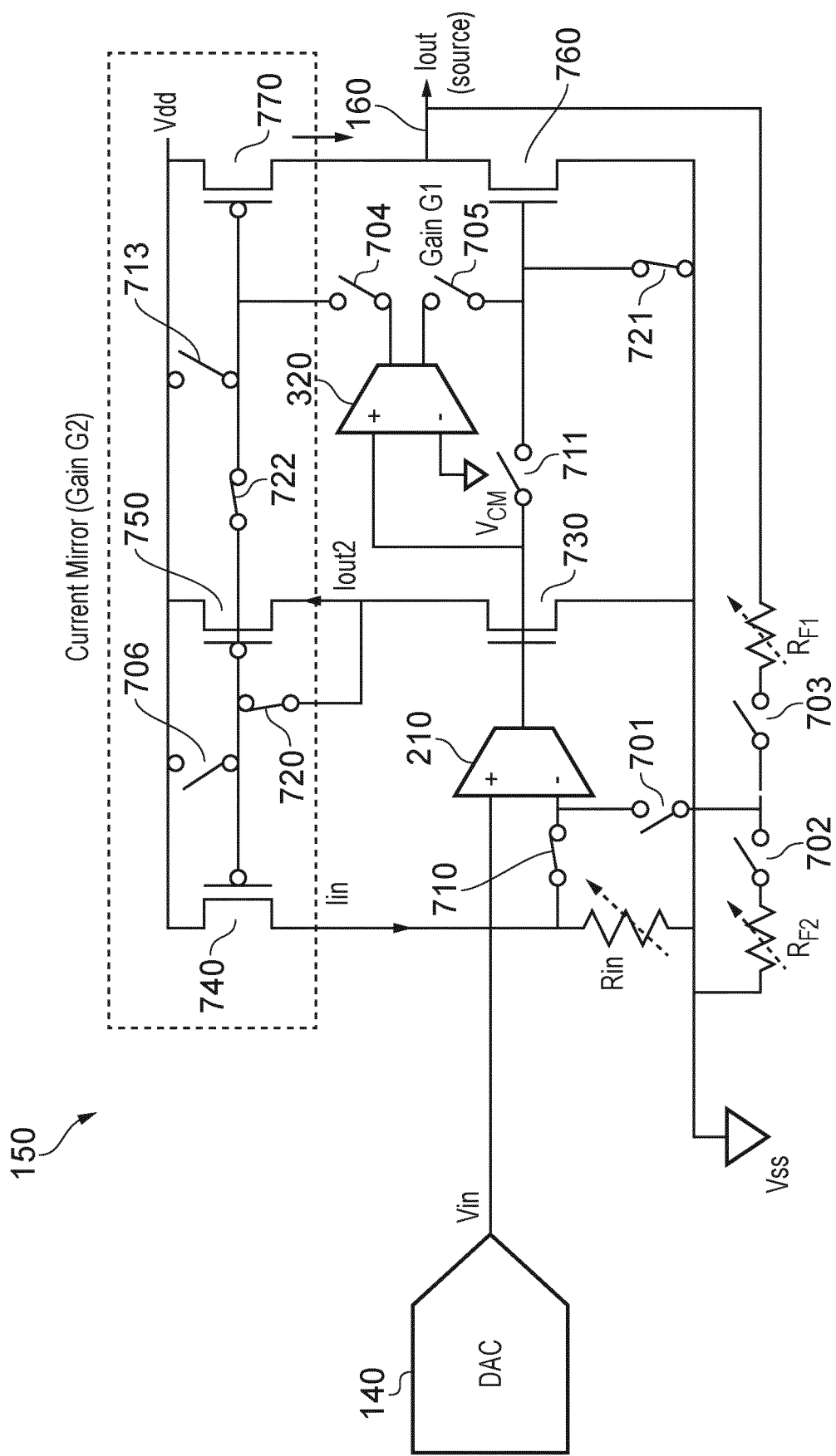

FIG. 7C shows the output stage 150 of FIGS. 7A and 7B, but with the switches provided in a current source configuration. In the current source mode, switches 710, 721, 720, 722 are closed. Switches 701, 702, 703, 704, 705, 711, 713, 706 are open. By this switch configuration, the output stage 150 illustrated in FIG. 7C is functionally equivalent to the output stage 150 illustrated in FIG. 6B. The transistors 730 in FIG. 7C may correspond to the transistor 650 in FIG. 6B. The lower supply VSS in FIG. 7C may correspond to the VCM in FIG. 6B. The resistor Rin in FIG. 7C may correspond to the resistor Rin in FIG. 6B. Furthermore, the transistors 740, 750 and 770 in FIG. 7C may form the current mirror 640 in FIG. 6B, whereby the drains of transistors 740, 750, 770 in FIG. 7C correspond to the output 642, input 641 and output 643 in FIG. 6B, respectively. As such, the first stage 210 in combination with the transistors 730, 740, 750, 770, and the resistor Rin will behave as a transconductance amplifier to convert the analog signal VIN into an output current. In particular, the transistor 770 which forms a current mirror with transistors 740 and 750, sources or supplies a current Isource at the output pin 160 in order to provide the output current Iout.

Although not shown, the IC 100 may include a controller and the switches in the output stage 150 in FIGS. 7A-7C may be configured to receive control signals from the controller in order to control the switches, such that the output stage 150 can operate in the voltage mode, current sink mode and current source mode as described above. A user can provide user input to the IC 100 (e.g. via one or more input terminals, via wireless communications means, or via a module of a system on-chip (SoC) or System in a Package (SiP) architecture of the IC 100) to choose the voltage mode, current sink mode or current source mode.

Advantageously, the output stage 150 shown in FIGS. 7A-7C is able to provide a voltage output mode, current sink mode and current source mode by sharing the same first stage 210 and sharing the same transistors 760/770. Sharing the first stage 210 between modes can lead to space and power savings as described above. Furthermore, the output transistors 760 and 770 are typically large in area in order to provide the class AB buffer functionality in the voltage mode and the transconductance functionality in the current source and sink modes. As such, reusing the same transistors 760 and 770 in the current and voltage modes offers significant space savings on-chip.

Although not illustrated in FIGS. 7A-7C, it will be appreciated that the output stage of FIGS. 7A-7C may be adapted to include the additional circuitry of FIGS. 3B/3C for use in the voltage mode. In particular, the output stage of FIGS. 7A-7C may be adapted to include the multiplexer 332 that multiplexes an alternative feedback path from another device pin 334, as shown in FIGS. 3B/3C and described above.

It should be appreciated that the configuration of FIGS. 7A-7C is one particular example of how the output stage may be switched and multiplexed to provide the voltage and current mode functionalities described in relation to FIGS. 3A and FIGS. 6A-6B, and other equivalent configurations are within the scope of this disclosure.

In some examples, the output stage 150 shown in FIGS. 7A-7C may be adapted to only provide a current sink mode and a current source mode without a voltage output mode. For example, the following components may be omitted: switches 701, 702, 703, feedback resistors RF1 and RF2 and the associated feedback path from the output pin 160 to the negative terminal of the first stage 210, and the driver 320 and associated switches 704 and 705. Advantageously, this may offer significant power and chip space savings where only current sink and current source modes are required and a voltage output mode is not required.

Figure 8A:
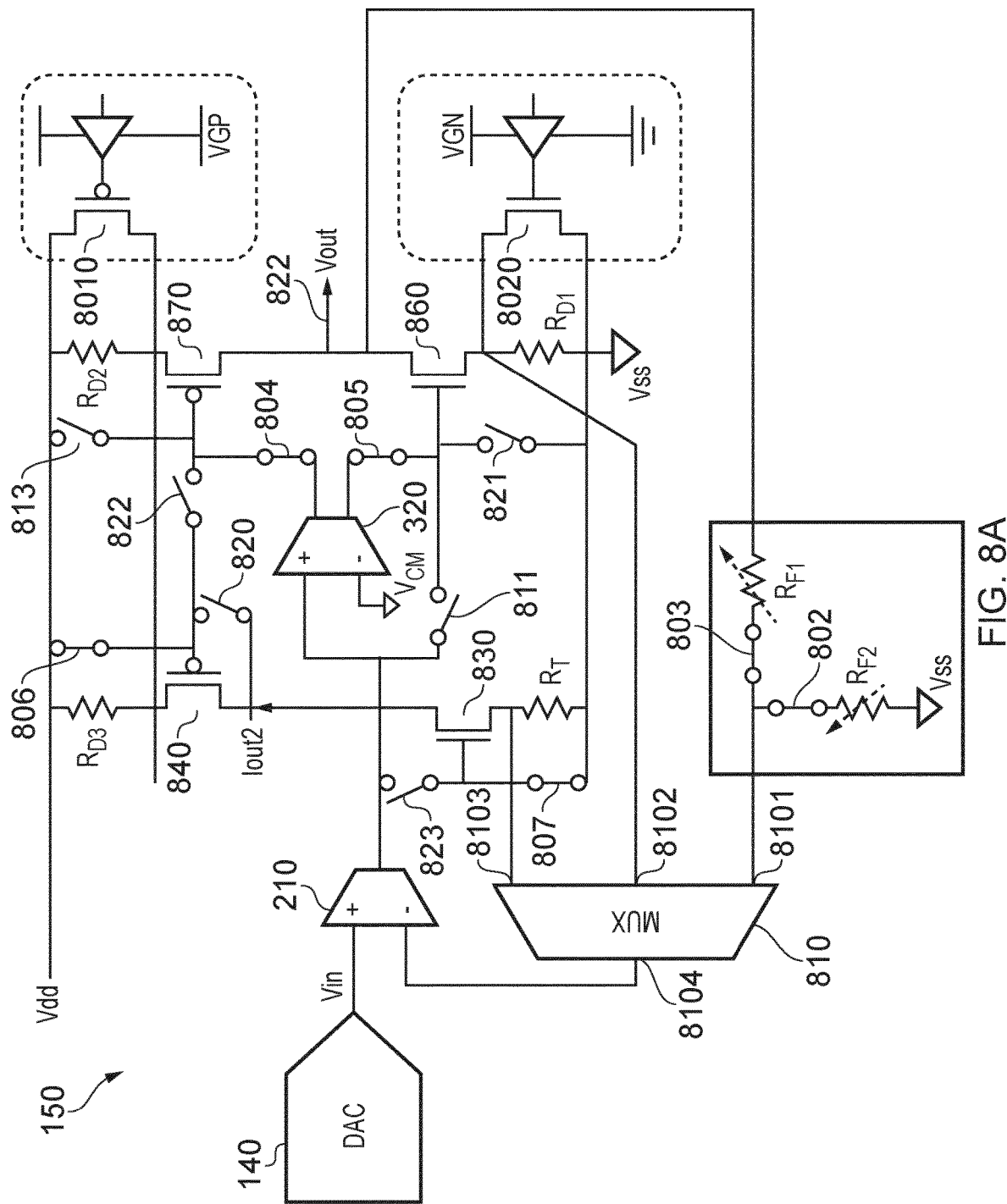
FIGS. 8A-8C show a combined circuit level view of the output stage of FIG. 2A that is configurable between a current source mode, a current sink mode and a voltage source mode, according to a further example of the present disclosure.

FIG. 8A illustrates a configurable output stage 150 configured to operate in a voltage output mode, a current sink mode and a current source mode, according to a further example. The output stage 150 comprises a first stage 210 as previously described above. The output stage further comprises a NMOS transistor 860 and a PMOS transistor 870. A source of the transistor 860 is coupled to a lower supply voltage VSS via a first degeneration resistor RD1. A drain of the transistor 860 is coupled to the output pin 160. A gate of the transistor 860 is coupled to the lower supply VSS via a switch 821. A drain of the transistor 870 is coupled to the output pin 160. A source of the transistor 870 is coupled to the upper supply voltage VDD via a second degeneration resistor RD2. A gate of the transistor 870 is coupled to the upper supply voltage via a switch 813.

The positive input of the first stage 210 is coupled to the output of the DAC 140 to receive the analog signal VIN. The negative input of the first stage is coupled to an output 8104 of a MUX 810. The MUX comprises a first input 8101, a second input 8102 and a third input 8103. The MUX is configured to couple each of its inputs to the output 8104 depending on the mode of operation of the output stage 150. The first input 8101 is coupled to the output pin 160 via a switch 803 in series with a first feedback resistor RF1. The first input is also coupled to the lower supply VSS via a switch 802 and a second feedback resistor RF2 provided in series. Preferably, the feedback resistors RF1 and RF2 are variable or programmable (e.g. analog or digitally) as previously described. Alternatively, the feedback resistors RF1 and RF2 may be static. The second input 8102 is coupled to the source of the transistor 860. The third input 8103 is coupled to a source of a NMOS transistor 830.

The output stage 150 comprises a driver 320 as previously described above. The output of the first stage 210 is coupled to the positive input of the driver 320. The negative input of the driver is coupled to a common mode or reference voltage VCM. A first output of the driver 320 is coupled to the gate of the PMOS transistor 870 via a switch 804. A second output of the driver 320 is coupled to the gate of the NMOS transistor 860 via a switch 805. The output of the first stage 210 is also coupled to the gate of the transistor 860 via a switch 811.

The output of the first stage 210 is also coupled to a gate of the transistor 830 via a switch 823. The gate of the transistor 830 is also coupled to the lower supply VSS via a switch 807. Furthermore, A source of the transistor 830 is coupled to the lower supply VSS via a resistor RT. Preferably, the resistor RT is a variable resistor (e.g. an analog or digitally programmable resistor) in accordance with the resistors discussed herein. Alternatively, the resistor RT may be static.

The output stage 150 further comprises a PMOS transistor 840. A drain of the transistor 840 is coupled to the drain of the transistor 830. A source of the transistor 840 is coupled to the upper supply voltage VDD via a third degeneration resistor RD3. A gate of the transistor 840 is coupled to the gate of the transistor 870 via a switch 822. The gate of the transistor 840 is also coupled to its drain via a switch 820. The gate of the transistor 840 is also coupled to the supply voltage VDD via a switch 806.

In some examples, the degeneration resistors RD1, RD2, RD3 are static. In other embodiments, the resistors RD1, RD2, RD3 are variable or programmable. In some examples, the degeneration resistors may be made variable by providing a MOS transistor in parallel with the resistor. For example, as shown in FIG. 8A, the output stage 150 may comprise a PMOS transistor 8010 in parallel with the second degeneration resistor RD2. A drain of the transistor 8010 may be coupled to the source of the transistor 870 and a source of the transistor 8010 may be coupled to the upper supply VDD. The gate of the transistor 8010 may be driven with a voltage VGP selected such that the transistor 8010 provides a desired resistance in parallel with RD2, thereby tuning the resistive path between the source of transistor 870 and the upper supply VDD.

Similarly, the output stage 150 may comprise a NMOS transistor 8020 in parallel with the first degeneration resistor RD1. A drain of the transistor 8020 may be coupled to the source of the transistor 860 and a source of the transistor 8020 may be coupled to the lower supply VSS. The gate of the transistor 8020 may be driven with a voltage VGN selected such that the transistor 8020 provides a desired resistance in parallel with RD1, thereby tuning the resistive path between the source of transistor 860 and the lower supply VSS. In an alternative arrangement, the resistors RD1 and RD2 may be omitted, and the degeneration resistance may be provided by the transistor 8010 and 8020 alone. Although not shown, it will also be appreciated that the degeneration resistor RD3 and the resistor RT may similarly be tuned with parallel MOS transistors (e.g. a NMOS for RT and a PMOS for RD3) as described above, or otherwise omitted and replaced with the MOS transistors as described above.

In FIG. 8A, the switches are illustrated in a voltage output mode configuration. In the voltage mode, switches 802, 803, 807, 804, 805, 806 are open. Switches 821, 823, 820, 822, 813, 811 are open. Furthermore, the MUX 810 selects the first input 8101. By this switch configuration, the output stage 150 illustrated in FIG. 8A is functionally equivalent to the output stage 150 shown in FIG. 3A. In particular, the first stage 210 amplifies the analog signal VIN by a closed loop gain determined by the values of RF1 and RF2. Preferably, RF1 and RF2 are selected such that the gain is approximately 2. However, the closed loop gain can be any other suitable value, including unity, as discussed above. Furthermore, the driver 320 drives the gates of the transistors 870 and 860 such that the driver 320, the transistors 860 and 870 function as a class AB buffer to output the voltage signal VOUT. VOUT may be viewed as an amplified and buffered version of VIN. The PMOS transistor 870 with the degeneration resistor RD2 may be viewed as an implementation of the current source ISS1 in FIG. 3A, and the NMOS transistor 760 with the degeneration resistor RD1 may be viewed as an implementation of the current sink ISS2 in FIG. 3A.

Figure 8B:
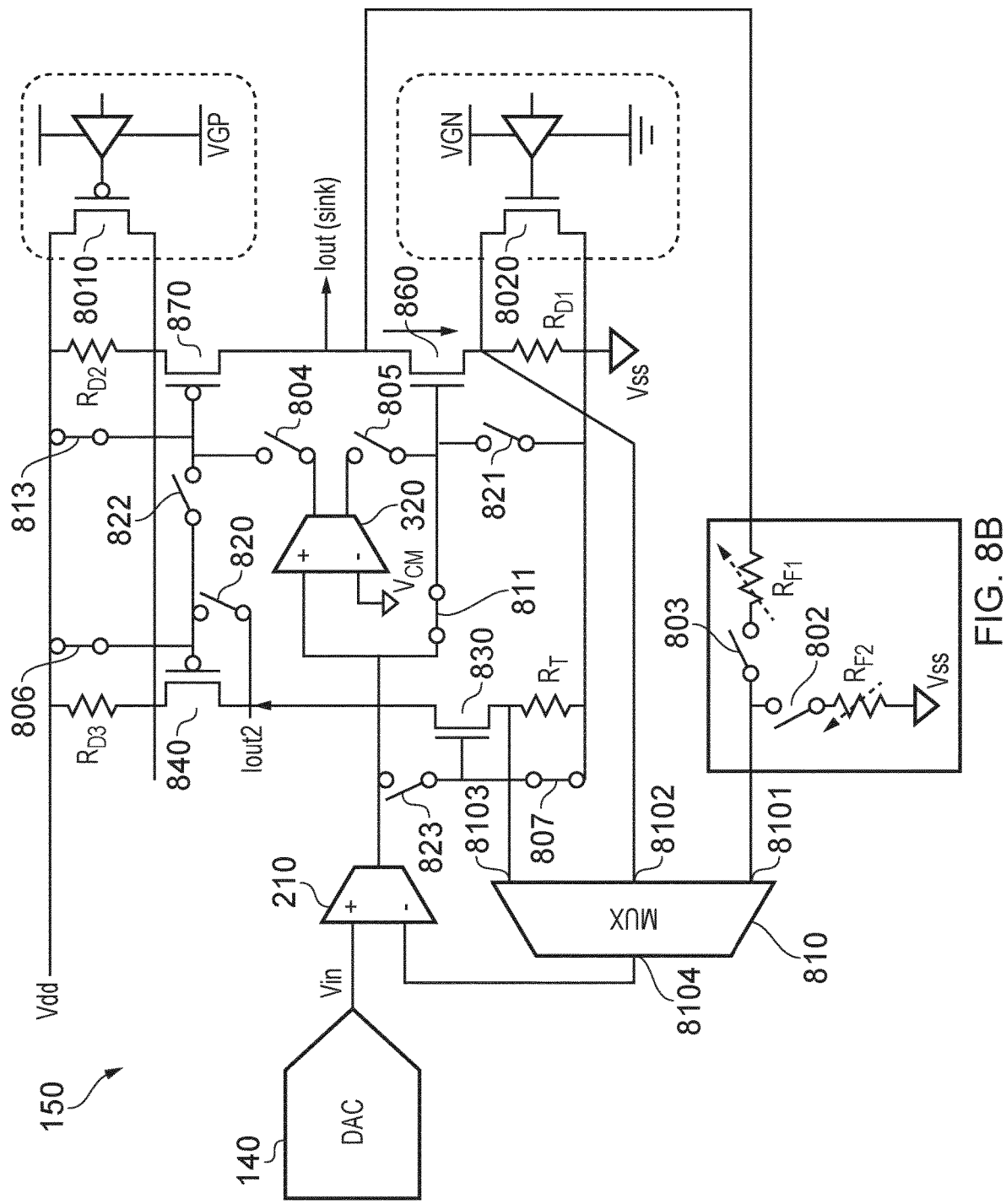

FIG. 8B shows the output stage 150 of FIG. 8A, but with the switches provided in a current sink configuration. In the current sink mode, switches 807, 811, 806, 813 are closed. Switches 802, 803, 823, 821, 804, 805, 820, 822 are open. Furthermore, the MUX 810 selects the second input 8102. By this switch configuration, the output stage 150 illustrated in FIG. 8B is functionally equivalent to the output stage illustrated in FIG. 4A. In particular, the transistor 860 in FIG. 8B may correspond to the transistor 420 in FIG. 4A, and the resistor RD1 in FIG. 8B may correspond to the resistor 410 in FIG. 4A. Furthermore, the MUX 810 in FIG. 8B provides the short circuit path between the source of the transistor 860 and the negative input to the first stage 210, similar to FIG. 4A. As such, the first stage 210 in combination with the transistor 860, resistor RD1, and MUX 810 will behave as a transconductance amplifier to convert the analog signal Vin into an output current. In particular, the drain of the transistor 860 sinks a current Isink in order to provide the output current Iout at the output pin 160 that is substantially proportional to the analog input VIN.

Figure 8C:
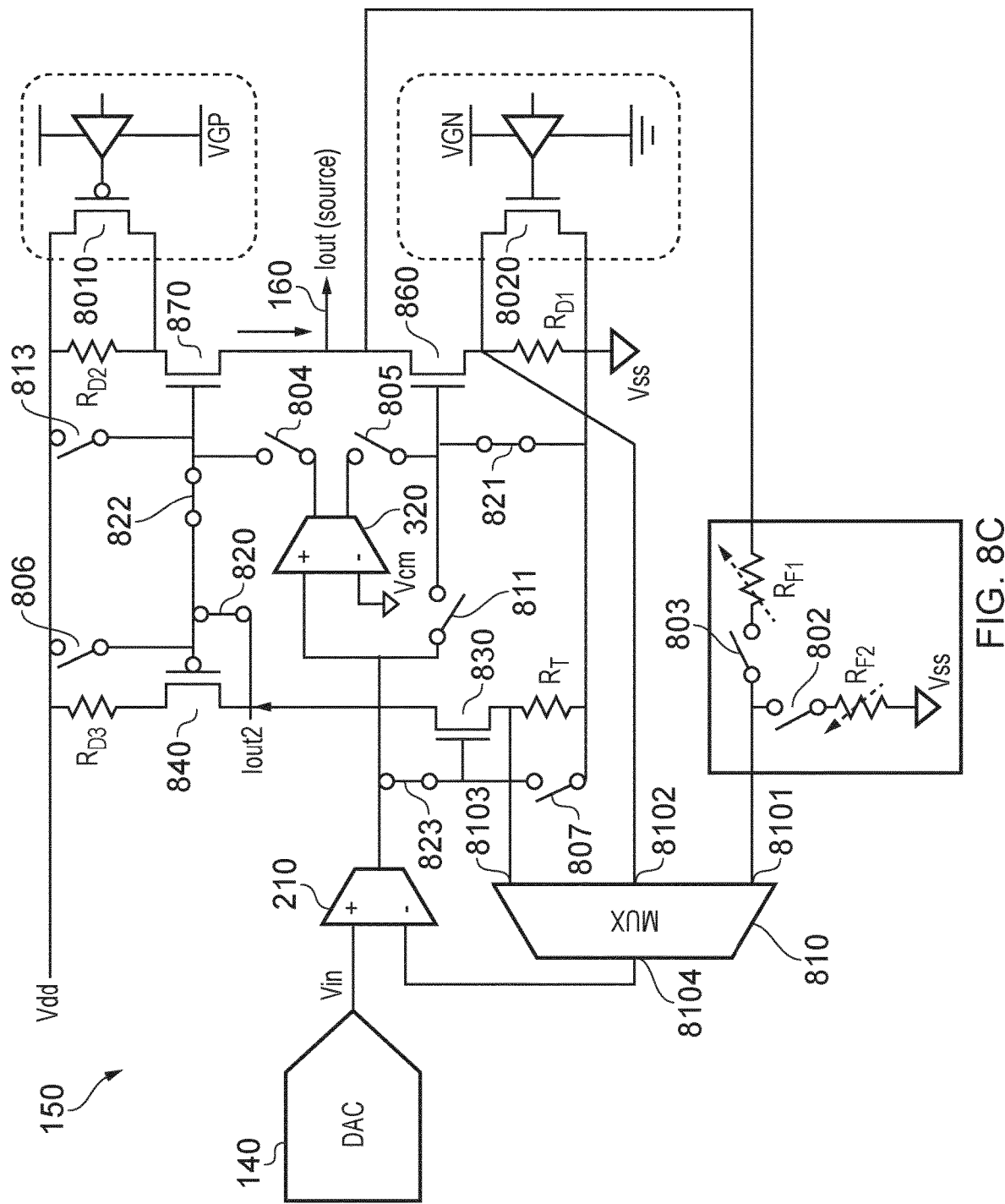

FIG. 8C shows the output stage 150 of FIGS. 8A and 8B, but with the switches provided in a current source configuration. In the current source mode, switches 821, 823, 820, 822, are closed. Switches 802, 803, 807, 804, 805, 806, 813, 811 are open. Furthermore, the MUX 810 selects the third input 8103. By this switch configuration, the output stage is functionally similar to a combination of the current output stages shown in FIGS. 4A and 6B. Similar to FIG. 4A, the first stage 210 drives the gate of the transistor 830 to generate a current Iout2 at the drains of the transistors 830 and 840. The negative input of the first stage 210 is short circuited with the source of the transistor 830 via the MUX 810, and therefore the first stage 210 in combination with the transistor 830, the resistor RT and the short circuit path form a transconductance amplifier. However, the transistors 840 and 870 are coupled in a current mirror configuration, such that the drain of the transistor 840 will act as an input to the current mirror and the drain of the transistor 870 will act as an output of the current mirror. As such, the current Iout2 generated by the transistor 830 is mirrored to the drain of the transistor 870. The transistor 870 thus sources or supplies a current to the output pin 160 to provide an output current Iout that mirrors the current Iout2 generated at the drain of transistor 830. In doing so, the circuit arrangement converts and outputs the analog input signal VIN into a current signal Iout.

FIGS. 8A-8C illustrate an example output stage 150 that utilises both a current mirror and degeneration resistances between MOS transistors and the supply voltages. Advantageously, degeneration can provide an enhanced performance and accuracy where headroom and power efficiency requirements allow. Moreover, degeneration may improve current stability in the output stage 150.

Although not shown, the IC 100 may comprise a controller and the switches in the output stage 150 in FIGS. 8A-8C may be configured to receive control signals from the controller in order to control the switches, such that the output stage 150 can operate in the voltage mode, current sink mode and current source mode as described above. A user can provide user input to the IC 100 (e.g. via one or more input terminals of the IC, via wireless communications means, or via a module of a system on-chip (SoC) or System in a Package (SiP) architecture of the IC 100) to choose the voltage mode, current sink mode or the current source mode.

Advantageously, the output stage 150 shown in FIGS. 8A-8C is able to provide a voltage output mode, current sink mode and current source mode by sharing the same first stage 210 and sharing the same transistors 860/870. Sharing the first stage 210 between modes can lead to space and power savings as described above. Furthermore, the output transistors 860 and 870 are typically large in area in order to provide the class AB buffer functionality in the voltage mode and the transconductance functionality in the current source and sink modes. As such, re-using the same transistors 860 and 870 in the current and voltage modes offers significant space savings on-chip.

Although not illustrated in FIGS. 8A-8C, it will be appreciated that the output stage of FIGS. 8A-8C may be adapted to include the additional circuitry of FIGS. 3B/3C for use in the voltage mode. In particular, the output stage of FIGS. 8A-8C may be adapted to include a multiplexer 332 that multiplexes an alternative feedback path from another device pin 334, as shown in FIG. 3B or 3C and otherwise described above.

It should be appreciated that the configuration of FIGS. 8A-8C is one particular example of how the output stage may be switched and multiplexed to provide the voltage and current mode functionalities using a current mirror with degeneration. Other equivalent configurations are within the scope of this disclosure.

Figure 9:
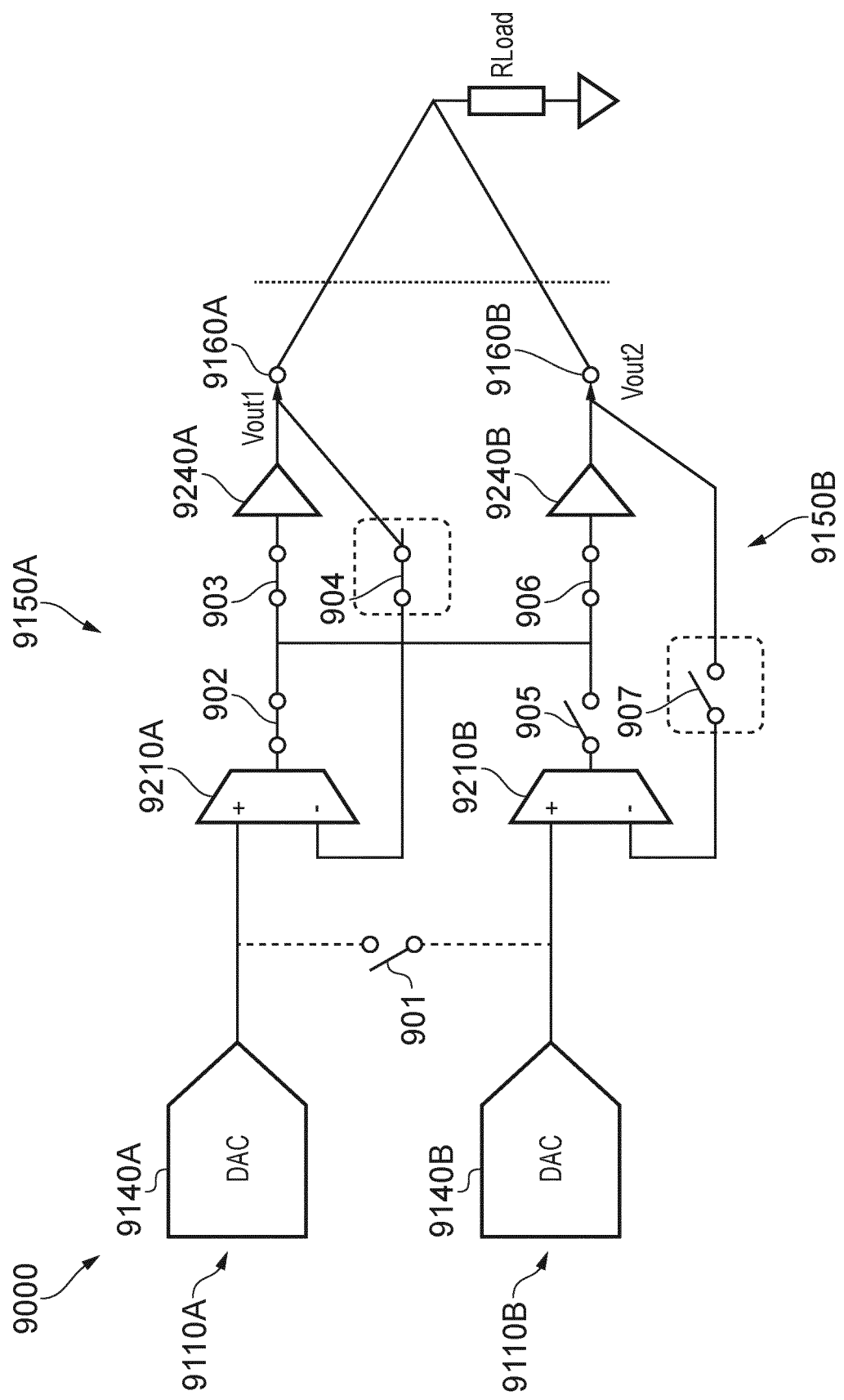
FIG. 9 shows an integrated circuit comprising a plurality of DAC channels operating in a shared voltage output mode, according to an example of the present disclosure.

FIG. 9 shows an integrated circuit 9000 comprising a first DAC channel 9110A and a second DAC channel 9110B according to a shared output voltage configuration. The DAC channels 9110A and 9110B may correspond to the DAC channel 110 that has been described above. In particular, the DAC channel 9110A comprises a DAC 9140A, an output pin 9160A, and a configurable output stage 9150A having a first stage 9210A and a voltage output stage 9240A as described above. Furthermore, the DAC channel 9110B comprises a DAC 9140B, an output pin 9160B, and a configurable output stage 9150B having a first stage 9210B and a voltage output stage 9240B as described above. As shown in FIG. 9, the output stage 9150A further comprises switches 902 and 903 in series between the first stage 9210A and the voltage output stage 9240A. The output stage 9150A further has a switch 904 in the feedback path between the output pin 9160A and the negative input of the first stage 9210A. The output stage 9150B also comprises switches 905 and 906 in series between the first stage 9210B and the voltage output stage 9240B and a switch 907 in the feedback path between the output pin 9160B and the negative input of the first stage 9210B. The IC 9000 also provides a short circuit between an intermediate node between the switches 902 and 903, and an intermediate node between the switches 905 and 906. Although not shown, the short circuit path may comprise a switch such that the short circuit can be enabled or disabled. Optionally, the IC 9000 may also provide a switch between the outputs of the DACs 9140A and 9140B to short circuit the outputs of the DACs 9140A and 9140B.

In the configuration shown, the DAC channels are in a voltage output mode. Furthermore, switches 902, 903, 904 and 906 are closed and switches 905 and 907 are open. Therefore, the output stage 9150A operates in a voltage mode as described above. However, in the output stage 9150B, the first stage 9210B is disabled. Instead, the voltage output stage 9240B is driven by the output of the first stage 9210A of the first channel. In other words, a common first stage 9210A is used to drive two voltage output stages 9240A and 9240B. Advantageously, the output pins 9160A and 9160B can be coupled to the same node of the same load Rload and provide double the current to the load Rload. At the same time, by disconnecting and powering down the first stage 9210B, there can be significant power savings in this configuration.

Optionally, the DACs 9140A and 9140B may be driven by the same input digital signal, and the outputs of the DACs 9140A and 9140B may be short circuited by closing the switch 901. This may enable further improvements in non-linearity and noise in the shared output voltage configuration. This can also improve performance in shared current output modes, reducing the DAC core non-idealities contributions as described below.

Otherwise, in a normal channel configuration (e.g. where channels 9110A and 9110B operate independently), the output pins 9160A and 9160B may be coupled to different loads. The switches 905 and 907 may also be closed. The switches 901 may be opened. The short circuit between the intermediate node between the switches 902 and 903, and the intermediate node between the switches 905 and 906, may be made open circuit (e.g. by opening a switch that is coupled between said intermediate nodes). Channels 9110A and 9110B may therefore independently operate in separate voltage output modes as described above.

Note that switches 904 and 907 are optional, whereby the skilled person will appreciate that the shared voltage modes and individual voltage modes described above may operate without the need for the switches 904 and 907. For example, switches 904 and 907 may be replaced by a short circuit, in which case in the shared voltage mode the first stage 9210B may simply be powered down and will nevertheless be disconnected from the voltage output stage 9240B and therefore not be driving anything.

Figure 10A:
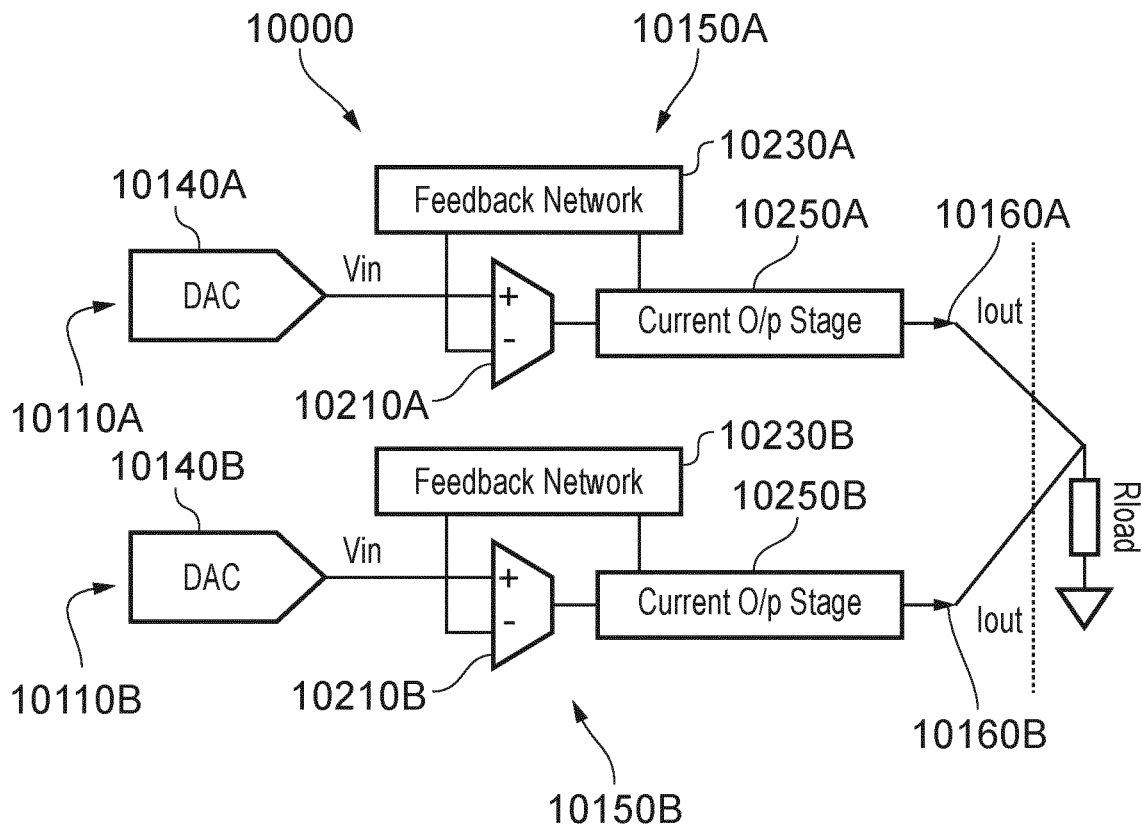
FIGS. 10A-10C show an integrated circuit comprising a plurality of DAC channels operating in a shared current output mode, according to examples of the present disclosure.

FIG. 10A shows an integrated circuit 10000 comprising a first DAC channel 10110A and a second DAC channel 101106 according to a shared output current configuration. The DAC channels 10110A and 101106 may correspond to the DAC channel 110 that has been described above. In particular, the DAC channel 10110A comprises a DAC 10140A, an output pin 10160A, and a configurable output stage 10150A having a first stage 10210A and a current output stage 10250A as described above. Furthermore, the DAC channel 10110B comprises a DAC 10140B, an output pin 10160B, and a configurable output stage 10150B having a first stage 10210B and a current output stage 10250B as described above. Each output stage 10150A and 10150B is in a current output mode (e.g. a current sink or current source output mode).

As shown in FIG. 10A, the output pins 10160A and 10160B of the two DAC channels may be coupled to the same node of the same load Rload. In this configuration, the DACs 10140A and 10140B may be driven by the same digital signal. Advantageously, this can provide increased amounts of current to the load Rload when each channel is operating in the same current mode. In particular, the output current may be doubled.

Figure 10B:
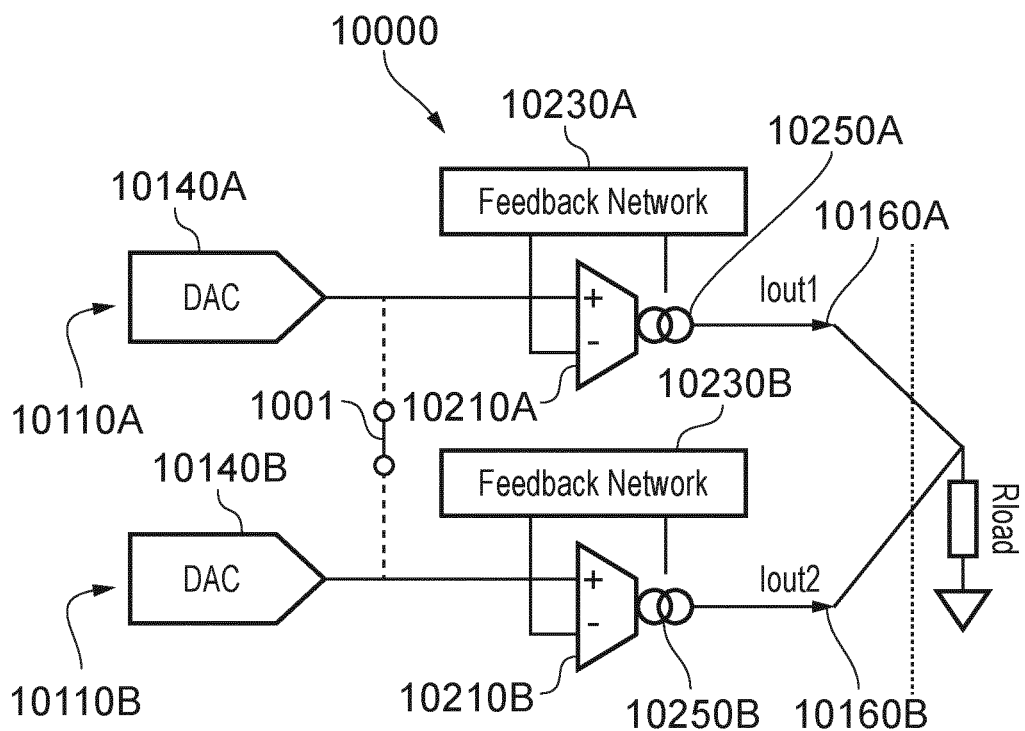

FIG. 10B shows a modification of FIG. 10A whereby a switch 1001 is provided between the outputs of the DACs 10140A and 10140B. In the shared current configuration, the switch 1001 is closed in order to short circuit the outputs of the DACs 10140A and 10140B. Advantageously, shorting the DAC outputs in the shared current mode may improve noise and non-linearity performance of the DAC channels.

Figure 10C:
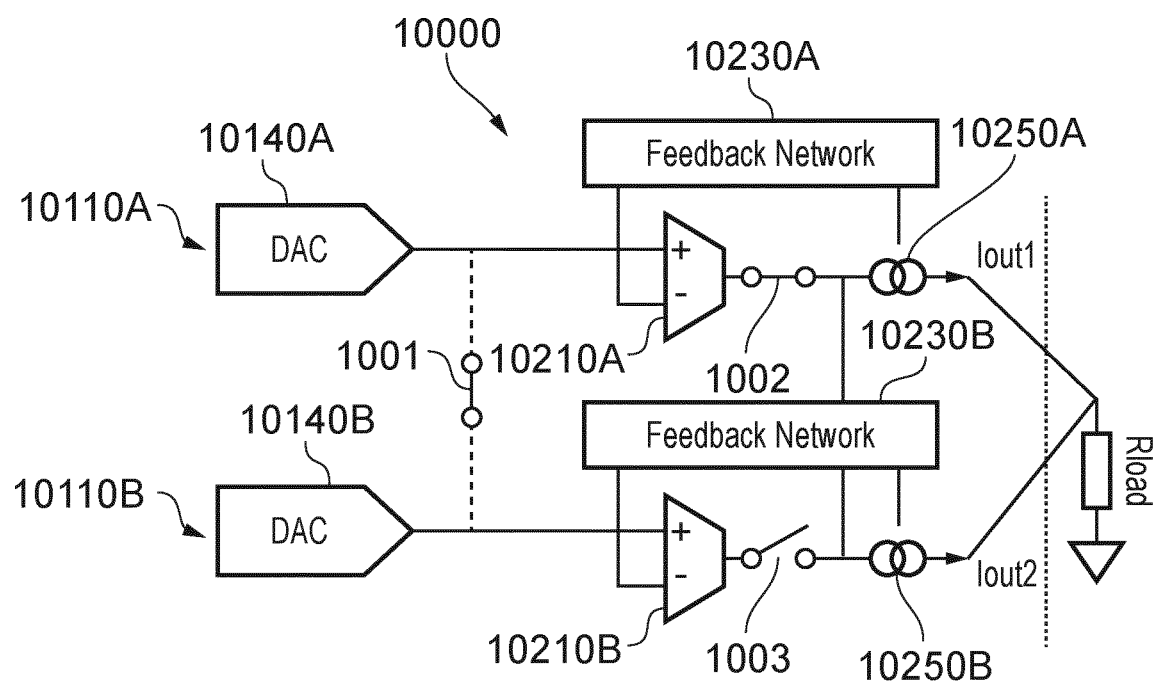

FIG. 10C shows a further modification of FIGS. 10A and 10B. In the configuration of FIG. 10C, an additional switch 1002 is provided in series between the output of the first stage 10210A and the current output stage 10250A. Furthermore, an additional switch 1003 is provided in series between the output of the first stage 10210B and the current output stage 10250B. Furthermore, the inputs to the current output stages 10250A and 10250B are short circuited, preferably via a switch (not shown). Additionally, the feedback network 10230B provides feedback to the negative input of the first stage 10210A of the channel 10110A. In this current output sharing configuration, the switch 1002 is opened and the switch 1003 is closed. As such, the output stage 10150A operates to generate an output current Iout1 as described above. However, the first stage 10210B is disabled and disconnected from the current output stage 10250B, and thus may be powered down.

Instead, the current output stage 10250B is driven by the first stage 10210A of the first channel. Accordingly, the feedback network 10230B of the second channel provides feedback to the negative terminal of the first stage 10210A instead of the first stage 10210B. In other words, a common first stage 10210A is used to drive two current output stages 10250A and 10250B. Advantageously, the output pins 10160A and 10160B can be coupled to the same node of the same load Rload and provide double the current to the load Rload. At the same time, by disconnecting and powering down the first stage 10210B, there can be significant power savings in this configuration. This shared first stage solution provided prevents a short-circuit condition which would otherwise occur if two fully independent amplifiers were used to drive the outputs to two slightly differing output levels due to non-idealities causing slightly different Vos values when the outputs are coupled together e.g. via low impedance PCB interconnections.

Optionally, in the configuration of FIG. 10C, the outputs of the DACs 10140A and 10140B may be short circuited via a switch 1001 in order to improve noise and non-linearity performance.

Otherwise, in a normal configuration (e.g. where channels 10110A and 10110B operate in separate current output modes), the output pins 10160A and 10160B may be coupled to separate loads, the switches 1002 and 1003 may be closed, the switch 1001 may be opened, the short circuit between the inputs of the current output stages 10250A and 10250B may be made open circuit (e.g. by opening a switch), and the feedback network 10230B may be disconnected from the first stage 10210A and connected to the negative input of the first stage 10210B.

Figure 11:
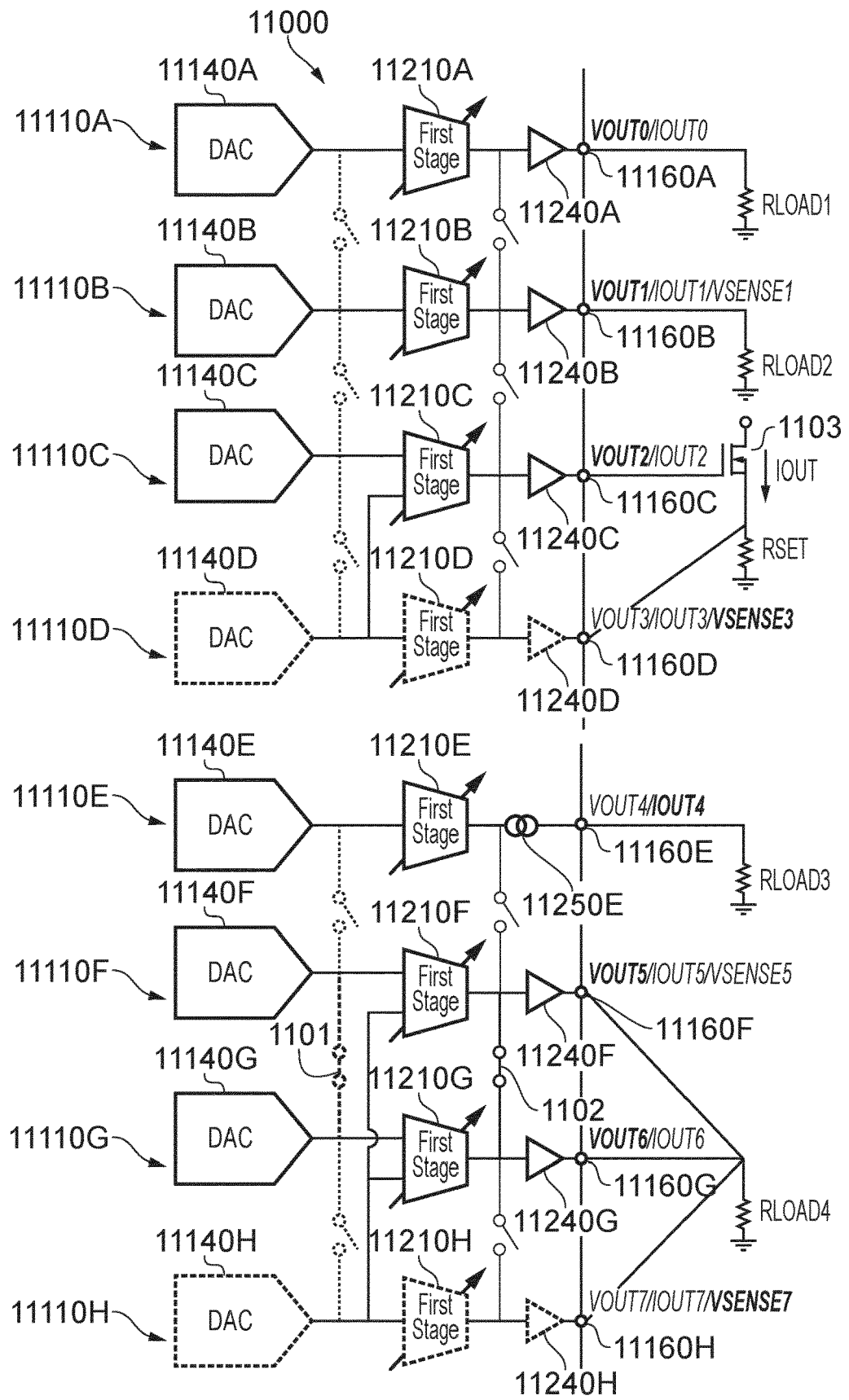
FIG. 11 shows an integrated circuit comprising a plurality of DAC channels operating in a combination of voltage output modes, current output modes, external feedback modes, external current output modes, and shared voltage output modes, according to examples of the present disclosure.

With the techniques described herein, a significant amount of DAC functionality can be provided on a single chip using fewer components and a limited number of channels, whilst achieving high performance and power savings. For example, FIG. 11 illustrates an example integrated circuit 11000 comprising eight DAC channels 11110A-11110H. Each DAC channel may correspond to any DAC channel described herein. For example, each DAC comprises at least a respective DAC 11140A-11140H, a respective output pin 11160A-11160H and a configurable output stage having at least a first stage 11210A-11210H. For the sake of simplicity, the output stages are not illustrated in detail.

The DAC channels 11110A and 11110B may be driving separate loads Rload1 and Rload2 respectively. As such, the respective output stages may be in a voltage output mode as previously described. As such, FIG. 11 shows that the channels 11110A and 11110B may be switched to use their respective voltage output stages 11240A and 11240B in combination with the respective first stages 11210A and 11210B and feedback networks (not shown).

The DAC channel 11110C may internally be in a voltage output mode, and therefore the voltage output stage 11240C is illustrated similar to channels 1110A and 1110B. However, the output pin 11160C may be driving a power transistor 1103 in order to provide an external high current mode. Furthermore, the output pin 11160D of the channel 11110D may be coupled close to the load RSET. The DAC 11140D and output stage of the channel 11110D may be disabled in order to provide a feedback path to the first stage 11210C of the channel 11110C to reduce the effect of IR losses between the output pin 11160C and the load RSET as previously described in relation to FIG. 3B.

The channel 11110E may be driving a load Rload3 in a current outmode mode, and therefore the current output stage 111250E is illustrated.

Channels 11110F and 11110G may be operating in a shared voltage mode as described above in relation to FIG. 9. In particular, the channel 11110F operates in a voltage output mode to provide an output voltage to the load Rload4. The voltage output stage 11240G of the channel 11110G is coupled to the output of the first stage 11210F of the channel 11110F via the closed switch 1102 and also provides an output voltage to the load Rload4. The first stage 11210G is disabled in this mode. Furthermore, the DAC 11140G has its output short circuited with the output of the DAC 11140F optionally via the switch 1101. The output pin 11160H of the channel 1110H is also coupled to the same load Rload4. However, the output stage and DAC of the channel 11110H is disabled such that a feedback path is provided to the first stage 11210F via the output pin 11160H, to account for IR losses in the paths between the output pins 11160F and 1160G, and the load Rload4.

Although not shown throughout the figures, it should be appreciated that any IC described herein may comprise a controller, controllers or any other appropriate control circuitry to control the output stage(s) so that each output stage may operate in and transition between the voltage output modes, current sink output modes, current source output modes, shared voltage output modes and shared current output modes described herein. In particular, the control circuitry may be appropriately configured to control switches and multiplexers to transition the output stage(s) between said output modes. The switches and multiplexers described may be configured to receive control signals from the control circuitry in order to change their states, such that the output stage(s) can operate in and transition between said output modes described herein.

It will be appreciated that where multiple channels are implemented on the IC (e.g. as in FIGS. 9, 10 and 11), the output stages are designed and implemented using best practice design and layout techniques so that the power and current delivery characteristics of each channel are substantially the same. Moreover, each channel can have substantially the same design and architecture.

Figure 13:
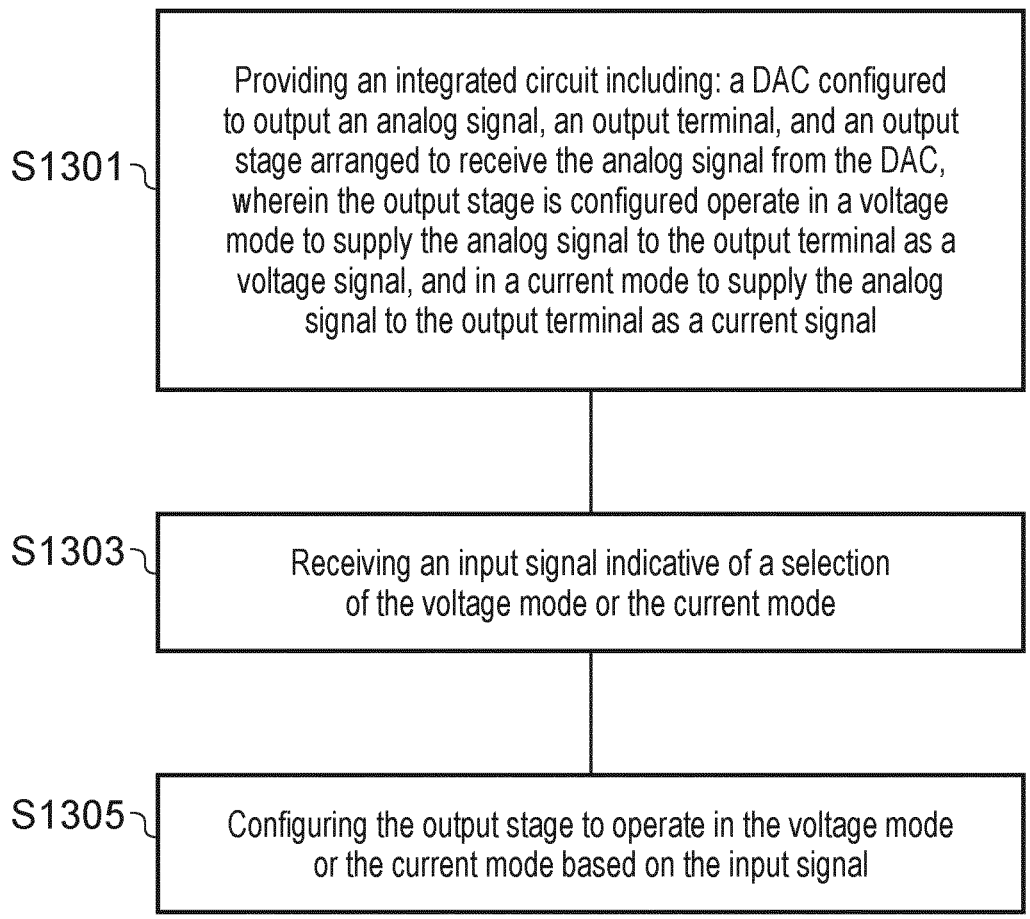
FIG. 13 illustrates a method according to an example of the present disclosure.

FIG. 13 illustrates a method according to an example of the present disclosure. At step S1301, an integrated circuit is provided, including a DAC configured to output an analog signal, an output terminal, and an output stage arranged to receive the analog signal from the DAC. The output stage is configured operate in a voltage mode to supply the analog signal to the output terminal as a voltage signal, and in a current mode to supply the analog signal to the output terminal as a current signal.

At step S1303, the integrated circuit receives an input (control) signal indicative of a selection of the voltage mode or the current mode. The control signal can be user input provided by a user. The user can choose the voltage mode or the current mode depending on their individual requirements for the channel. The input control signal can be provided via an input terminal of the integrated circuit, via wireless communications means, or via a module of a system on-chip (SoC) or System in a Package (SiP) architecture of the IC 100

At step S1305, the integrated circuit configures the output stage to operate in the voltage mode of the current mode, based on the input signal. In particular, the integrated circuit configures the output stage based on which mode the user has chosen, as indicated by the input signal.

The integrated circuit can configure the output stage into the relevant operating mode using any of the techniques described herein. For example, the integrated circuit may change the states of switches so that the output stage operates in the selected mode. This may involve switching in voltage mode circuitry or current mode circuitry. Moreover, this may involve combining the voltage mode circuitry with other circuitry in the output stage, or combining the current mode circuitry with the same other circuitry in the output stage. As such, the other circuitry is shared between the operating modes.

OTHER VARIATIONS

Each channel has been described above as having an output pin. However, it will be appreciated that the output pins may be more generally referred to as output terminals. Different types of output terminals can be realised for different integrated circuit packages, depending on the technology implemented. For example, the output terminals may be pins, bumps, balls, leadframes, bondwire pads or otherwise. In preferred implementations, the output terminals are for outputting or supplying signals off-chip. In some examples however, the output terminals can be internal on-chip terminals for supplying signals to other on-chip components.

The DACs described herein can be implemented according to any known technique. The DAC can be any voltage DAC. The DAC can otherwise be a current DAC, a C-DAC (capacitive DAC), an active MOS divider and/or include a resistor network.

FIGS. 3A-8C illustrate possible implementations of the DAC channel shown in FIGS. 1-2C. It will be appreciated that other implementations are within the scope of this disclosure which achieve similar functionality. In particular, other circuit topologies of the current output stage, the voltage output stage and the feedback networks can be used.

It will be appreciated that switch positions and arrangements different to those described and illustrated herein can be implemented, provided that they allow for equivalent functionalities. For example, any switch arrangement can be used that allows the output stage to operate in a voltage mode and at least one of a current source and current sink mode. Furthermore, any switch arrangement can be used that allows multiple channels to operate in shared voltage modes and shared current modes.

It will be appreciated that the switches described in the present disclosure may be implemented using any type of electronic or electrical switch, for example using one or more FET devices (e.g. MOSFETs, CMOS switches), logic gates or otherwise. The switches may be made from any of NMOS or PMOS technology, or a combination of both in parallel (transmission gate configuration). In some cases more complex switches such as sequential switches may be used to avoid power supply sequencing problems, for example where separate power supply domains are used. T-switches may also be used to improved isolation between the nodes on either sides of the switch when the switch is "off". FET designs used to implement the switches used can include planar FETs, high-k FETs, HKMG transistors, 2.5D finFETs, and gate-all-around (GAA) FETs. Double-diffused FET devices (DMOS) may also be used and can be advantageous for high voltage applications specifically. Any other variation of FET device can be used. Low off-leakage switches discussed herein can be implemented using FETs with a relatively high threshold voltage.

Moreover, the above described switches and FETs can be used to implement the multiplexers discussed herein.

Moreover, it will be appreciated that a user can interact with the integrated circuit 100 to change the states of the switches in various different ways. In some examples, the integrated circuit 100 includes non-volatile memory (NVM) which controls the states of the switches. Additionally or alternatively, the integrated circuit 10 includes software registers that control the states of the switches. A user can program the NVM or software registers to select the operating states of the switches in accordance with the desired performance mode. In some examples, the NVM or software registers are pre-programmed or "hard coded" with a set of predetermined switch state combinations. Each one of the predetermined switch state combinations may correspond to specific performance modes. As such, a user may not have the freedom to select the state of each individual switch, and may instead select a mode from a set of predefined performance modes. The NVM or software registers may then set the states of the switches in accordance with the selected performance mode.

Figure 12A:
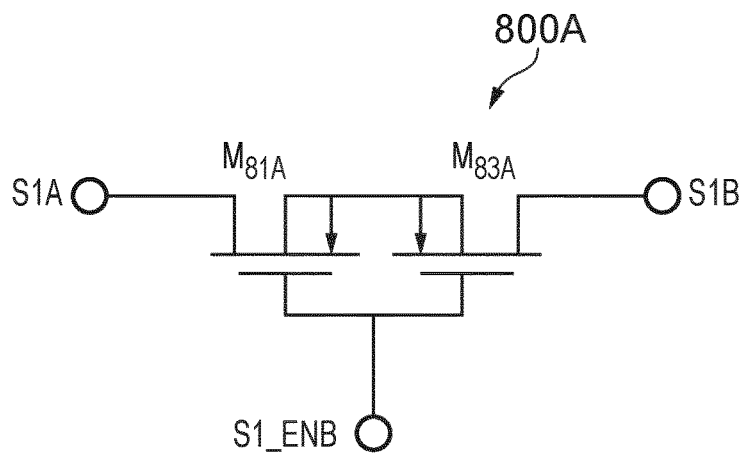
FIGS. 12A-12C show examples of switches that can be used in the integrated circuits of the present disclosure.

FIG. 12A illustrates an example switch 800A which may be used in the examples of the present disclosure. The switch 800A includes PMOS transistors M81A and M83A. The drain of M81A is coupled to a first terminal S1A of the switch 800A. The drain of M83A is coupled to a second terminal SIB of the switch. The sources of M81A and M83A are coupled to each other. The gates of M81A and M83A are coupled to each other. The backgates of M81A and M83A are also coupled together. The gates of M81A and M83A form a control terminal S1_ENB to the switch 800A. For example when a signal at the terminal S1_ENB is "high", the switch 800A may close to form a short circuit between the terminals S1A and SIB. When the signal at the terminal S1_ENB is "low", the switch 800A may open to form an open circuit between the terminals S1A and S1B. Advantageously, there is no forward diode formed between the transistors M81A and M83A, which means that the switch 800A can more effectively and efficiently change states.

Figure 12B:
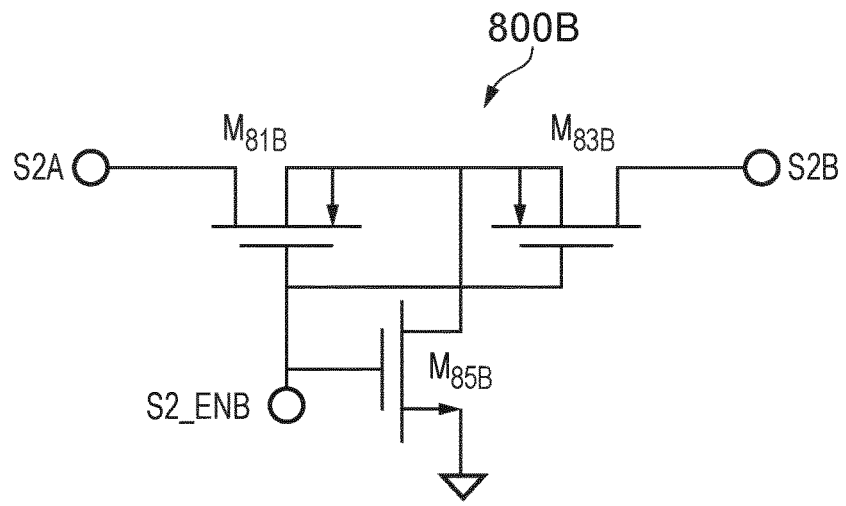

FIG. 12B illustrates another example switch 800B which may be used in the examples of the present disclosure. The switch 800B in FIG. 18B is an example of a T-switch. The switch 800B includes PMOS transistors M81B, M83B and a NMOS transistor M85B. The drain of M81B is coupled to a first terminal S2A of the switch 800B. The drain of M83B is coupled to a second terminal S2B of the switch 800B. The sources of M81B and M83B are coupled to each other. The gates of M81B and M83B are coupled to each other. The drain of M85B is coupled to the sources of M81B and M83B. The gate of M85B is coupled to the gates of M81B and M83B. The source of M85B may be coupled to a reference voltage. The gates of M81B, M83B and M85B form a control terminal S2_ENB to the switch 800A. For example when a signal at the terminal S2_ENB is "high", the switch 800B may close to form a short circuit between the terminals S2A and S2B. When the signal at the terminal S2_ENB is "low", the switch 800B may open to form an open circuit between the terminals S2A and S2B. Advantageously, the T-switch 800B does not have a diode path across it and is therefore robust to power supply sequencing tests and use across different power supply domains. Furthermore, the switch 800B has improved isolation properties. The transistor M85B will tie the node in between the sources of the transistors M81B and M83B to ground when the switch is "off" (open) which gives it a low impedance, thereby improving the isolation between the terminals S2A and S2B in the off state.

Figure 12C:
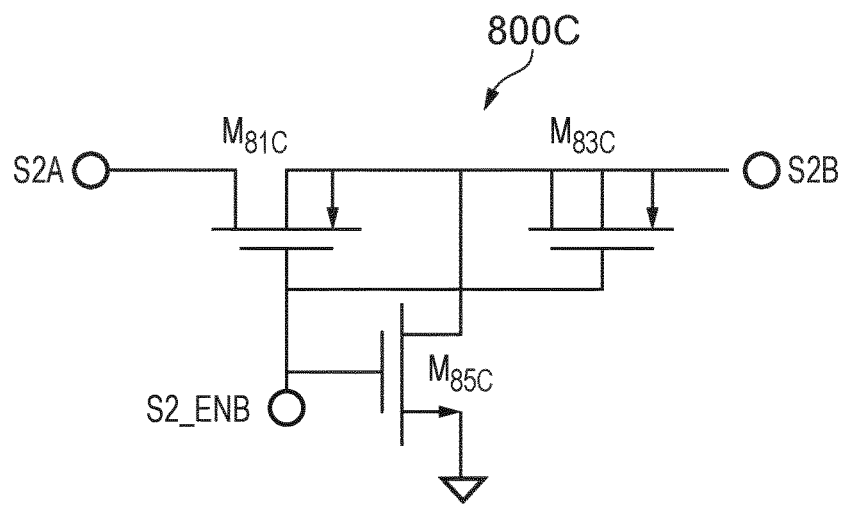

FIG. 12C illustrates another example of a T-switch 800C. The T-switch 800C is similar to the T-switch 800B. However, the transistor M83C is reversed such that its drain is coupled to the source of M81C and its source is coupled to the terminal S2B. As such, the drain of M8C is coupled to the source of M81C and the drain of M83C. The switch 800C may have improved isolation characteristics like the switch 800B, but may not be as robust to switch sequencing techniques.

Although FIGS. 12A-12C show PMOS switch implementations, it will be appreciated that opposite polarity (NMOS) switches may be implemented in a similar way.

It will be appreciated that any other type of switch implementation is within the scope of the present disclosure.

In some examples, the switches described herein can be implemented using fuses, such as one time programmable (OTP) fuses. Any other suitable fuse can be used. The fuses are provided originally in a short circuit state. As such, before the integrated circuit 100 is operated, the states of some fuses are changed to an open circuit state based on user input, in accordance with the desired performance mode. Alternatively, the switches can be implemented using antifuses which are originally provided in an open circuit state. As such, before the integrated circuit 100 is operated, the states of some fuses are changed to a closed circuit state based on user input, in accordance with the desired performance mode. An example of an antifuse is described in U.S. Pat. No. 7,755,162.

In some examples, the configurable output stages of the present disclosure can automatically change between the voltage mode and a current mode. For example, the output stage can be configured to detect high current requirements at the load. If high current requirements are detected, it can be determined that the output stage should be operating in a current output mode, and therefore the output stage can change its mode to a current mode accordingly.

It will be appreciated that various biasing techniques can be used to implement FET devices discussed herein, including e.g. bulk biasing techniques such as backward, forward or adaptive bulking biasing (BBB, FBB and ABB respectfully). Advantageously, such biasing techniques can be useful for achieving a wider input voltage range of the FET devices, reducing off-state leakage in switches (e.g. to provide low off-leakage switches discussed herein), and varying the threshold voltage if or as required. Backward or adaptive bulk biasing techniques may be particularly useful for providing the low off-leakage switches discussed herein.

It will be appreciated that known best practice techniques can be used to minimise the effects of parasitic impedances and layout dependent effects (LDEs) resulting from the switch arrangements and circuit configurations discussed herein. For example, implementations can be verified using simulations. Similarly, best practice techniques may be used to make the implementation robust to other integrated circuit manufacturing, packaging and thermal considerations.

The current sources described herein can be any suitable type of current source, including but not limited to simple (e.g. single device) MOS current sources, cascaded MOS current sources, or any other suitable type of current source.

It will be appreciated that the symbols Vdd and Vss in the present disclosure are used to indicate upper and lower voltage supplies, respectively. Moreover, in some examples, Vss can be ground.

In the above description, it is described how the output stage of a DAC channel can be operated in a voltage output mode or a current output mode. In some examples, the current output mode is a current source mode. In some examples, the current output mode is a current sink mode. In some examples, the output stage can be operated in each of the voltage mode, current source mode and current sink modes. It will be appreciated that in some implementations, the voltage mode can be omitted. As such, the output stage can be operated in a current source mode or a current sink mode without the option of a voltage mode. The current source mode can supply or provide a positive current signal to the output pin. The current sink mode can sink or provide a negative current signal to the output pin. Advantageously, the DAC channel does not need to provide additional circuitry for the voltage mode, thereby saving on chip area.

Further Examples

According to an example of the present disclosure, there is provided an integrated circuit comprising:
  a DAC configured to output an analog signal;
  an output pin; and
  an output stage coupled between an output of the DAC and the output pin, the output stage configured to receive the analog signal and operate in a voltage mode to supply the analog signal as a voltage output signal to the output pin, and in a current mode to supply the analog signal as a current output signal to the output pin.

In some examples, the output stage comprises a first stage having an input coupled to the output of the DAC, voltage mode circuitry and current mode circuitry.

In some examples, the integrated circuit is configured to switchably combine the first stage with the voltage mode circuitry in the voltage mode such that the output stage operates as a voltage amplifier and/or voltage buffer.

In some examples, the integrated circuit is configured to switchably combine the first stage with the current mode circuitry in the current mode, such that the output stage operates as a voltage-to-current amplifier and/or a transconductance amplifier.

In some examples, the voltage mode circuitry comprises a voltage buffer switchably coupled between the output of the first stage and the output pin, and a bias circuit switchably provided in a feedback path between the output pin and an input of the first stage, wherein the bias circuit is configured to determine a gain of the first stage.

In some examples, the feedback path of the voltage mode circuitry is between a second output pin of the integrated circuit and the input of the first stage.

In some examples, the current mode circuitry comprises at least one transistor, a resistor and a feedback path between the at least one transistor and an input to the first stage, wherein the transistor, resistor and feedback path are switchably coupled to the first stage such that they combine with the first stage to form a transconductance amplifier.

In some examples, the feedback path of the current mode circuitry comprises a short circuit between a source of the at least one transistor and the input of the first stage.

In some examples, the feedback path of the current mode circuitry comprises a current mirror configured to replicate a current drawn by the at least one transistor and supply the replicated current to the input to the first stage.

In some examples, a drain of the at least one transistor of is coupled to the output pin to output a converted current to the output pin.

In some examples, the current mode circuitry comprises a current mirror configured to replicate a current drawn by the at least one transistor and supply the replicated current to the output pin.

In some examples, the voltage mode circuitry is configured to use, in the voltage mode, the at least one transistor and/or a transistor of the current mirror that supplies current to the output pin.

In some examples, the output stage comprises a plurality of switches and/or multiplexers arranged to transition the output stage between the voltage and current modes.

In some examples, the integrated circuit comprises a controller configured to control the switches and/or multiplexers.

According to another example of the present disclosure, there is provided an integrated circuit comprising:
- a plurality of DAC channels, each channel comprising a DAC, an output pin and an output stage according to the first aspect of the present disclosure.

In some examples, the plurality of DAC channels includes:
- a first DAC channel having a first DAC, a first output pin and a first output stage according to the first aspect, and
- a second DAC channel having a second DAC, a second output pin and a second output stage according to the first aspect,
- the integrated circuit further comprising a switch coupled between the output of the first DAC and the output of the second DAC.

In some examples:
- each of the first DAC channel and the second DAC channel comprises a first stage, current mode circuitry and voltage mode circuitry according to the first aspect, and
- the first stage of the first output stage is switchably coupled to the voltage mode circuitry of the second output stage, such that the voltage mode circuitry of the first output stage and the voltage mode circuitry of the second output stage can be driven by the first stage of the first output stage.

In some examples, the first stage of the first output stage is switchably coupled to the current mode circuitry of the second output stage, and the feedback path of the current mode circuitry of the second output stage is switchably coupled to an input of the first stage of the first output stage, such that the current mode circuitry of the first output stage and the current mode circuitry of the second output stage can be driven by the first stage of the first output stage.

The invention claimed is:

1. An integrated circuit, comprising:
a DAC configured to output an analog signal;
an output terminal; and
an output stage arranged to receive the analog signal from the DAC,
wherein the output stage is configured to operate in a first mode to supply the analog signal to the output terminal as a first signal type, and in a second mode to supply the analog signal to the output terminal as a second signal type;
wherein the output stage includes first shared circuitry, first mode circuitry and second mode circuitry, wherein the integrated circuit is configured to combine the first shared circuitry with the first mode circuitry in a first mode, and combine the first shared circuitry with the second mode circuitry in a second mode, wherein the first mode circuitry and the second mode circuitry are arranged between an output of the first shared circuitry and the output terminal.

2. The integrated circuit of claim 1, wherein the integrated circuit is configured to receive a control signal and select the first mode or the second mode of the output stage based on the control signal.

3. The integrated circuit of claim 2, wherein the output stage is configured to operate in a current source mode in which current is sourced to the output terminal to supply the analog signal to the output terminal as a current signal, and/or in a current sink mode in which current is sunk from the output terminal to supply the analog signal to the output terminal as a current signal.

4. The integrated circuit of claim 2, wherein the first mode circuitry includes voltage mode circuitry and the second mode circuitry includes current mode circuitry,
wherein the integrated circuit is configured to combine the first shared circuitry with the voltage mode circuitry in a voltage mode, and combine the first shared circuitry with the current mode circuitry in a current mode.

5. The integrated circuit of claim 4, wherein the first shared circuitry includes a differential amplifier.

6. The integrated circuit of claim 4, wherein the first shared circuitry combines with the voltage mode circuitry to form a voltage amplifier.

7. The integrated circuit of claim 4, wherein the first shared circuitry combines with the current mode circuitry to form a voltage-to-current converter, optionally wherein the voltage-to-current converter is a voltage controlled current source or a transconductance amplifier.

8. The integrated circuit of claim 4, wherein the voltage mode circuitry and the current mode circuitry include second shared circuitry,
wherein the second shared circuitry is combined with the first shared circuitry in both the voltage mode and the current mode of the output stage.

9. The integrated circuit of claim 8, wherein the second shared circuitry includes a current source, wherein the current source is used to supply an output current to the output terminal in both the voltage mode and the current mode.

10. The integrated circuit of claim 8, wherein the second shared circuitry includes a transistor, wherein the transistor is used as an output transistor of a voltage amplifier in the voltage mode.

11. The integrated circuit of claim 10, wherein in the current mode, the transistor is used in a voltage-to-current converter, or
wherein in the current mode, the transistor is used in a current mirror, the current mirror being arranged to replicate an output current of a voltage-to-current converter at the output terminal.

12. The integrated circuit of claim 10, further comprising a degeneration resistor coupled between the transistor and a supply voltage.

13. The integrated circuit of claim 4, wherein the voltage mode circuitry includes a feedback impedance network arranged in a feedback path between the output terminal and the first shared circuitry, wherein the feedback path is disabled in the current mode.

14. The integrated circuit of claim 1, wherein the first mode is a voltage mode and the first signal type is a voltage signal, and wherein the second mode is a current mode and the second signal type is a current signal.

15. The integrated circuit of claim 1, wherein the output stage has an adjustable gain in each of the first and the second modes.

16. The integrated circuit of claim 1, wherein the integrated circuit comprises a plurality of circuit elements, each circuit element being changeable between a short circuit state and an open circuit state, the circuit elements being arranged so that the output stage can be operated in the first mode by selecting first states of the circuit elements, and the output stage can be operated in the second mode by selecting second states of the circuit elements.

17. A method comprising:
   providing an integrated circuit including:
      a DAC configured to output an analog signal,
      an output terminal, and
      an output stage arranged to receive the analog signal from the DAC,
         wherein the output stage is configured to operate in a voltage mode to supply the analog signal to the output terminal as a voltage signal, and in a current mode to supply the analog signal to the output terminal as a current signal;
         wherein the output stage includes first shared circuitry, voltage mode circuitry and current mode circuitry, wherein the integrated circuit is configured to combine the first shared circuitry with the voltage mode circuitry in a voltage mode, and combine the first shared circuitry with the current mode circuitry in a current mode, wherein the voltage mode circuitry and the current mode circuitry are arranged between an output of the first shared circuitry and the output terminal;
   receiving a control signal indicative of a selection of the voltage mode or the current mode;
   configuring the output stage to operate in the voltage mode or the current mode based on the control signal.

18. The method of claim 17, wherein configuring the output stage to operate in the voltage mode comprises combining first shared circuitry with voltage mode circuitry, and wherein configuring the output stage to operate in the current mode comprises combining the first shared circuitry with current mode circuitry.

19. An integrated circuit comprising:
   a plurality of channels including a first channel and a second channel, each channel comprising:
      a DAC configured to output an analog signal,
      an output terminal, and
      an output stage arranged to receive the analog signal from the DAC,
      wherein each output stage is configured to operate in a voltage mode to supply the analog signal to the output terminal as a voltage signal, and in a current mode to supply the analog signal to the output terminal as a current signal;
      wherein each output stage includes first shared circuitry, voltage mode circuitry and current mode circuitry, wherein the integrated circuit is configured to combine respective first shared circuitry with respective voltage mode circuitry in the voltage mode, and combine respective first shared circuitry with respective current mode circuitry in a current mode, wherein the respective voltage mode circuitry and the respective current mode circuitry are arranged between an output of the respective first shared circuitry and the respective output terminal.

20. The integrated circuit of claim 19, wherein each output stage includes a first stage and the current mode circuitry, wherein in the current mode the current mode circuitry is coupled to an output of the first stage, wherein the output stages are configured to operate in a shared current mode in which the current mode circuitry of the second channel is driven by the output of the first stage of the first channel.

* * * * *